(12) United States Patent
Bak et al.

(10) Patent No.: US 10,177,307 B2
(45) Date of Patent: Jan. 8, 2019

(54) METHODS OF FABRICATING MAGNETIC MEMORY DEVICES

(71) Applicants: Junghoon Bak, Suwon-si (KR); Myoungsu Son, Yongin-si (KR); Boyoung Seo, Suwon-si (KR)

(72) Inventors: Junghoon Bak, Suwon-si (KR); Myoungsu Son, Yongin-si (KR); Boyoung Seo, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 12 days.

(21) Appl. No.: 15/474,388

(22) Filed: Mar. 30, 2017

(65) Prior Publication Data

US 2018/0069175 A1 Mar. 8, 2018

(30) Foreign Application Priority Data

Sep. 6, 2016 (KR) ........................ 10-2016-0114501

(51) Int. Cl.
| | |
|---|---|
| *H01L 43/12* | (2006.01) |
| *G11C 14/00* | (2006.01) |
| *H01L 29/82* | (2006.01) |
| *G11C 11/56* | (2006.01) |
| *G11C 19/02* | (2006.01) |
| *H01L 27/22* | (2006.01) |
| *G11C 11/15* | (2006.01) |
| *H01L 43/02* | (2006.01) |
| *H01L 43/08* | (2006.01) |

(52) U.S. Cl.
CPC .............. *H01L 43/12* (2013.01); *G11C 11/15* (2013.01); *G11C 11/5607* (2013.01); *G11C 14/0036* (2013.01); *G11C 19/02* (2013.01); *H01L 27/222* (2013.01); *H01L 27/224* (2013.01); *H01L 29/82* (2013.01); *H01L 43/02* (2013.01); *H01L 43/08* (2013.01); *G11C 2211/5615* (2013.01)

(58) Field of Classification Search
CPC ..... H01L 27/222; H01L 27/224; H01L 43/02; H01L 43/12; H01L 29/82; H01L 43/08; G11C 11/15; G11C 11/5607; G11C 14/0036; G11C 19/02; G11C 2211/5615
See application file for complete search history.

(56) References Cited

U.S. PATENT DOCUMENTS 8,138,562 B2  3/2012 Mao
8,334,213 B2  12/2012 Mao
(Continued)

FOREIGN PATENT DOCUMENTS

| KR | 10-2010-0076556 A | 7/2010 |
|---|---|---|
| KR | 10-1073132 B1 | 10/2011 |
| KR | 10-2012-0086938 A | 8/2012 |

*Primary Examiner* — Joseph C. Nicely
(74) *Attorney, Agent, or Firm* — Muir Patent Law, PLLC

(57) ABSTRACT

Disclosed is a method of fabricating a magnetic memory device. The method of a fabricating a magnetic memory device includes forming an interlayer dielectric layer on a substrate, forming a sacrificial pattern in the interlayer dielectric layer, forming a magnetic tunnel junction pattern on the sacrificial pattern, after forming the magnetic tunnel junction pattern, selectively removing the sacrificial pattern to form a bottom contact region in the interlayer dielectric layer, and forming a bottom contact in the bottom contact region.

20 Claims, 42 Drawing Sheets

(56) References Cited

U.S. PATENT DOCUMENTS

| | | |
|---|---|---|
| 8,491,799 B2 | 7/2013 | Jung |
| 9,166,154 B2 | 10/2015 | Satoh et al. |
| 9,246,082 B2 | 1/2016 | Tokashiki |
| 9,306,156 B2 | 4/2016 | Noh et al. |
| 2011/0183516 A1* | 7/2011 | Lee ................... H01L 21/7682 438/653 |
| 2015/0014801 A1 | 1/2015 | Satoh et al. |
| 2015/0069559 A1* | 3/2015 | Tsubata ................ H01L 43/02 257/421 |
| 2015/0207064 A1* | 7/2015 | Lee ..................... H01L 43/12 438/3 |
| 2015/0236251 A1* | 8/2015 | Noh ..................... H01L 43/12 438/3 |
| 2015/0287912 A1* | 10/2015 | Park .................... H01L 43/12 257/421 |
| 2015/0311433 A1* | 10/2015 | Bae ..................... H01L 43/12 438/3 |
| 2017/0092851 A1* | 3/2017 | Han ..................... H01L 43/12 |
| 2017/0092852 A1* | 3/2017 | Son ..................... H01L 43/12 |
| 2017/0345869 A1* | 11/2017 | Park .................... H01L 27/222 |
| 2018/0158867 A1* | 6/2018 | Kim .................... H01L 27/228 |
| 2018/0197914 A1* | 7/2018 | Jeong .................. H01L 27/222 |

\* cited by examiner

METHODS OF FABRICATING MAGNETIC MEMORY DEVICES

CROSS-REFERENCE TO RELATED APPLICATIONS

This U.S. nonprovisional patent application claims priority under 35 U.S.C § 119 to Korean Patent Application 10-2016-0114501 filed on Sep. 6, 2016, with the Korean Intellectual Property Office, entire contents of which are hereby incorporated by reference.

BACKGROUND

The present disclosure relates to a method of fabricating a magnetic memory device, and more particularly, to a method of fabricating a magnetic memory device including a magnetic tunnel junction pattern.

As electronic devices trend toward high speed and lower power consumption, demands for semiconductor memory devices having high-speed read/write operations and low operating voltages characteristics have been increasing. In order to meet these demands, magnetic memory devices have been proposed as semiconductor memory devices. Since magnetic memory devices may operate at high speed and have nonvolatile characteristics, their popularities as being the next generation of memory devices have been increasing.

A magnetic memory device is a memory device using a magnetic tunnel junction (MTJ). The magnetic tunnel junction may include two magnetic layers and an insulation layer interposed therebetween, and the resistance of the magnetic tunnel junction may vary depending on magnetization directions of the two magnetic layers. Specifically, the magnetic tunnel junction may have a relatively high resistance when the magnetization directions of the two magnetic layers are anti-parallel to each other, and may have a relatively low resistance when the magnetization directions of the two magnetic layers are parallel to each other. The magnetic memory device may write/read data using the resistance difference of the magnetic tunnel junction.

In particular, a spin transfer torque magnetic random access memory (STT-MRAM) device is becoming popular as a high-integrated memory device due to its characteristics where write current decreases with decreasing of a size of magnetic cells.

SUMMARY

Embodiments of the present disclosure provide a method of fabricating a magnetic memory device having enhanced reliability.

An object of the present disclosure is not limited to the above-mentioned one, other objects which have not been mentioned above will be clearly understood to those skilled in the art from the following description.

According to exemplary embodiments of the present disclosure, a method of fabricating a magnetic memory device may comprise: forming an interlayer dielectric layer on a substrate; forming a sacrificial pattern in the interlayer dielectric layer; forming a magnetic tunnel junction pattern on the sacrificial pattern; after forming the magnetic tunnel junction pattern, selectively removing the sacrificial pattern to form a bottom contact region in the interlayer dielectric layer; and forming a bottom contact in the bottom contact region.

According to exemplary embodiments of the present disclosure, a method of fabricating a magnetic memory device may comprise: providing a substrate including a first region and a second region that are adjacent to each other along a first direction; forming a first interlayer dielectric layer on the substrate; forming a sacrificial pattern in the first interlayer dielectric layer, the sacrificial pattern extending from the first region onto the second region along the first direction; forming magnetic tunnel junction patterns on the sacrificial pattern on the first region, the magnetic tunnel junction patterns being arranged along the first direction; after forming the magnetic tunnel junction patterns, removing the sacrificial pattern to form a bottom contact region in the first interlayer dielectric layer on the first region; and forming a bottom contact filling the bottom contact region.

According to exemplary embodiments of the present disclosure, a method of fabricating a magnetic memory device may include: providing a substrate including a first region and a second region that are adjacent to each other along a first direction; forming a first interlayer dielectric layer on the substrate; forming a sacrificial pattern in the first interlayer dielectric layer, the sacrificial pattern extending from the first region onto the second region along the first direction; forming a magnetic structure on the sacrificial pattern on the first region; after forming the magnetic structure, selectively removing the sacrificial pattern to form a bottom contact region in the first interlayer dielectric layer on the first region; and forming a bottom contact filling the bottom contact region.

BRIEF DESCRIPTION OF THE DRAWINGS

FIGS. 2A to 12A are plan views illustrating a method of fabricating a magnetic memory device according to exemplary embodiments of the present disclosure.

FIGS. 2B to 12B are cross-sectional views taken along line I-I' of FIGS. 2A to 12A, respectively.

FIGS. 2C to 12C are cross-sectional views taken along line II-II' of FIGS. 2A to 12A, respectively.

DETAILED DESCRIPTION OF EMBODIMENTS

Figure 1:
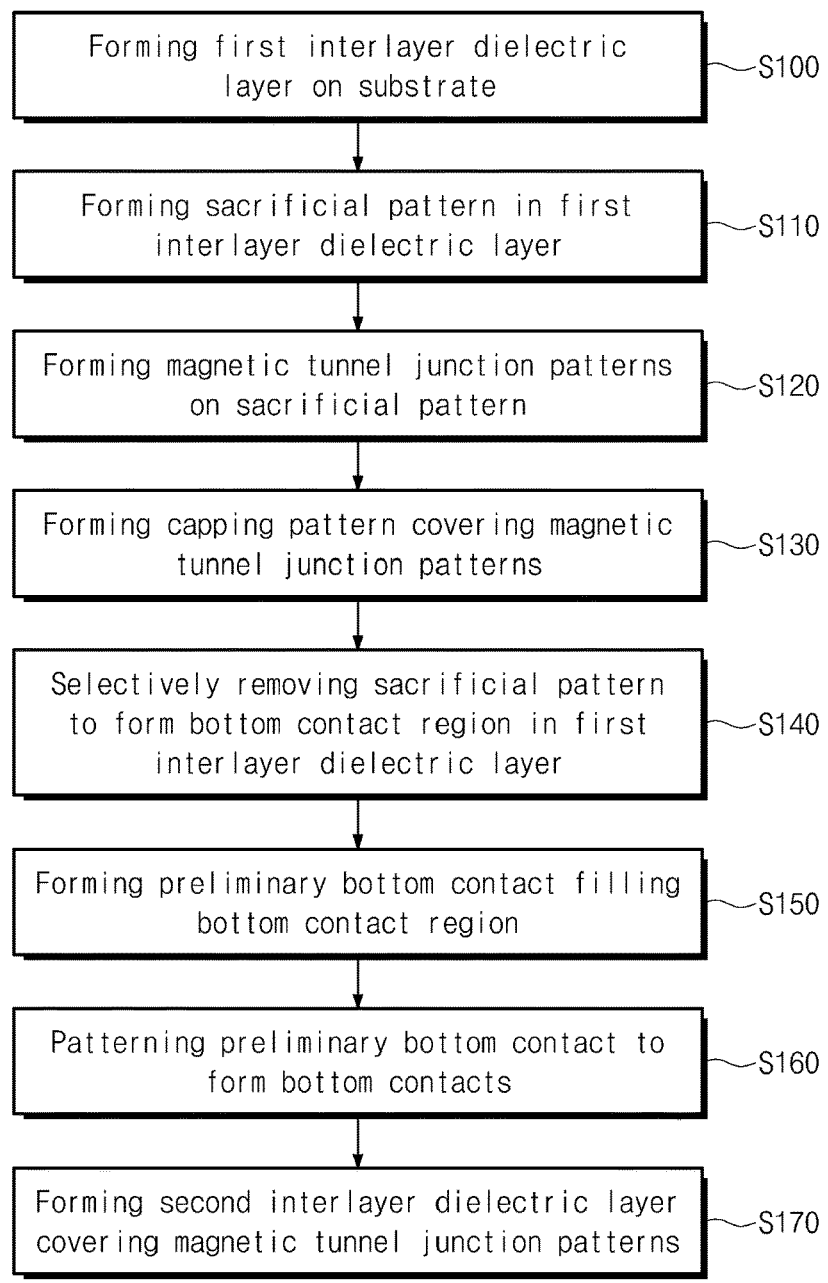
FIG. 1 is a flow chart illustrating a method of fabricating a magnetic memory device according to exemplary embodiments of the present disclosure.

It will be described herein about exemplary embodiments of the present disclosure with reference to the accompanying drawings. Like reference numerals may indicate like components throughout the description.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

Figure 3A:
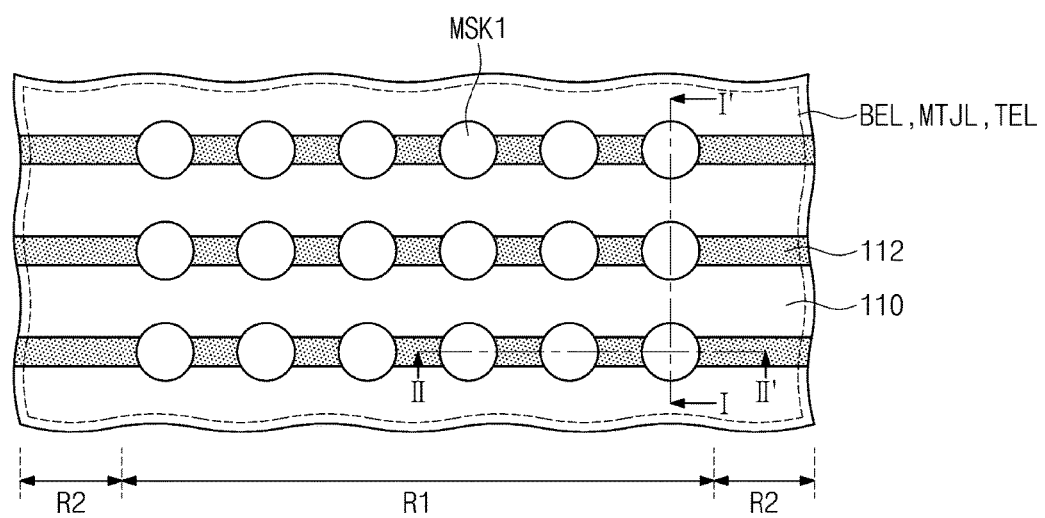
Figure 3A:
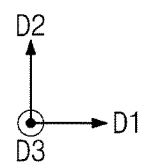
Figure 3B:
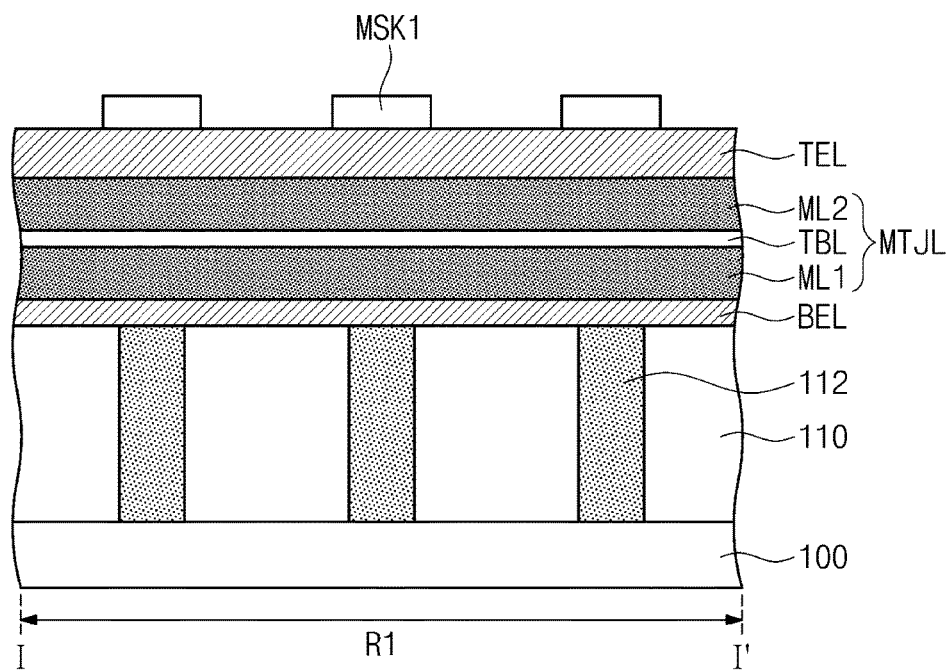
Figure 3C:
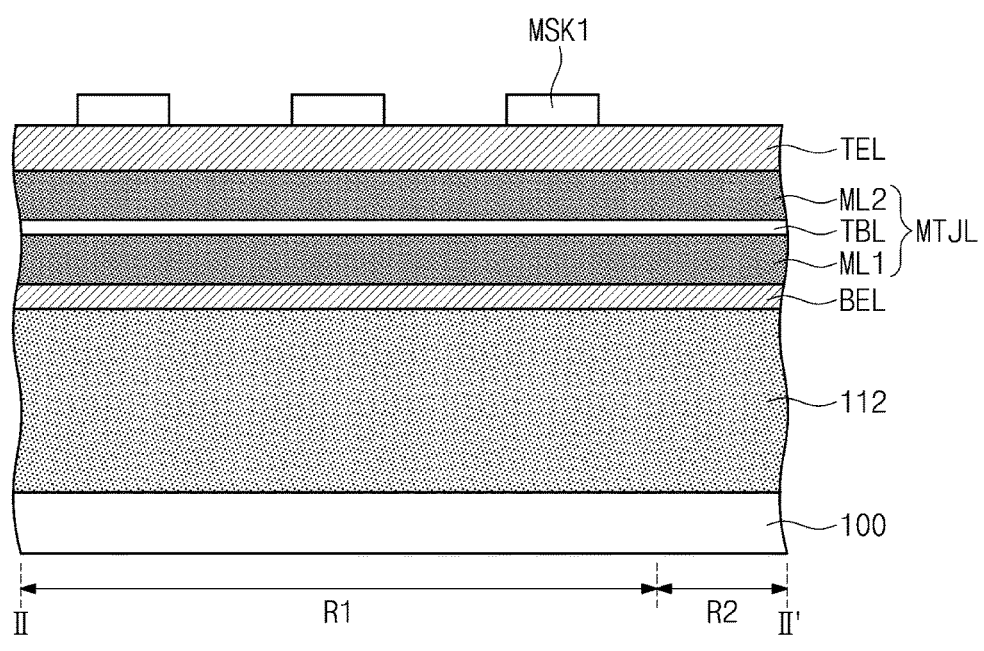
Figure 4A:
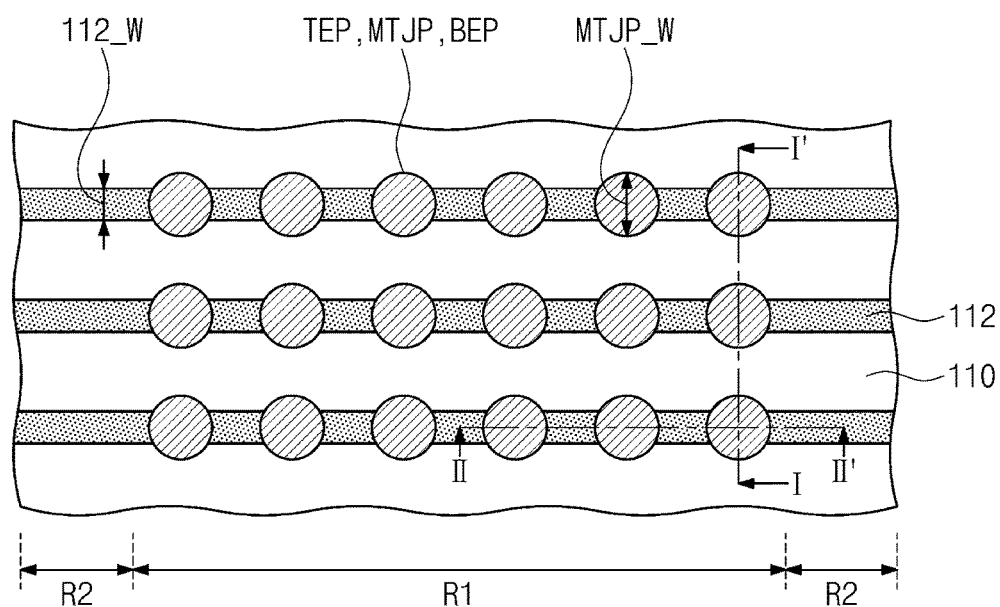
Figure 4A:
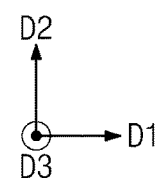
Figure 4B:
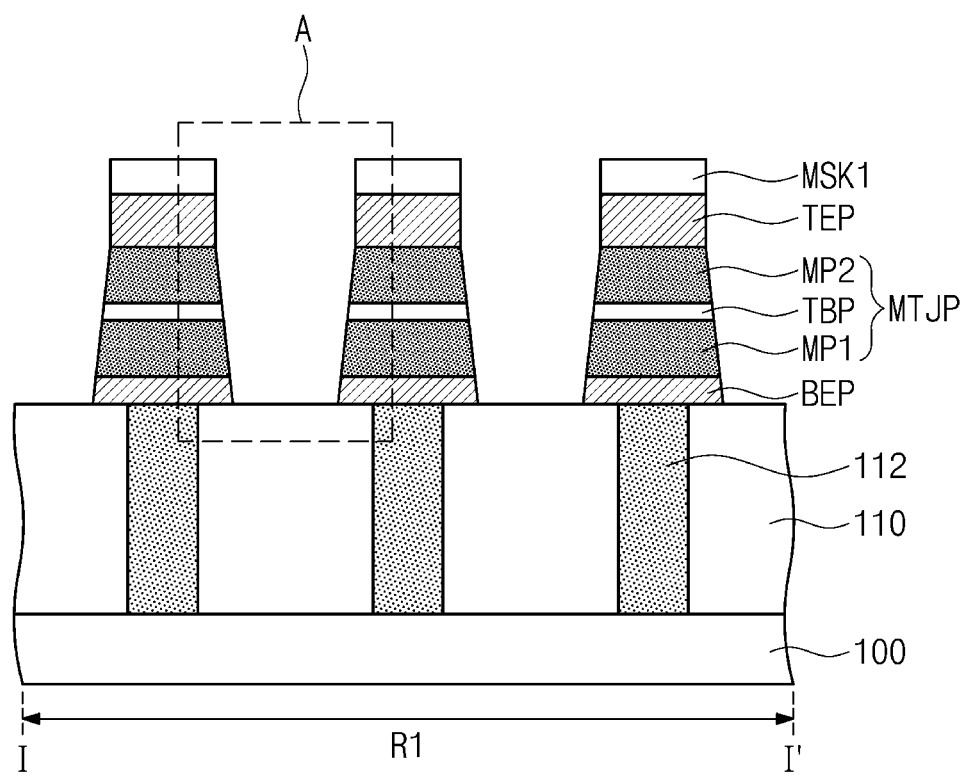
Figure 4C:
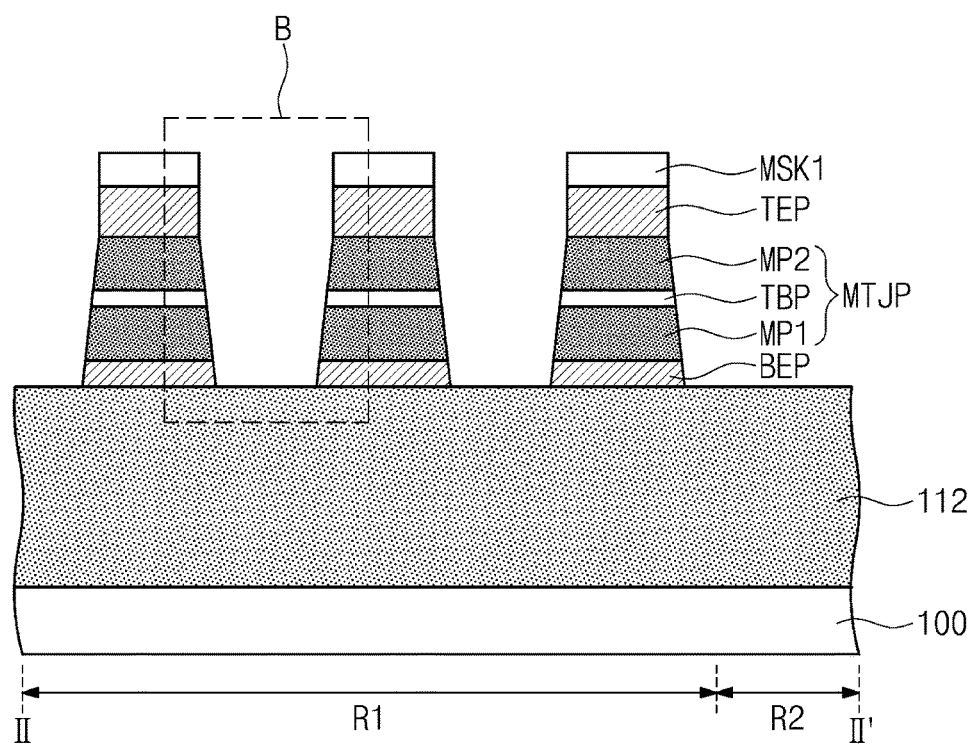
Figure 4C:
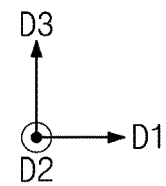
Figure 4D:
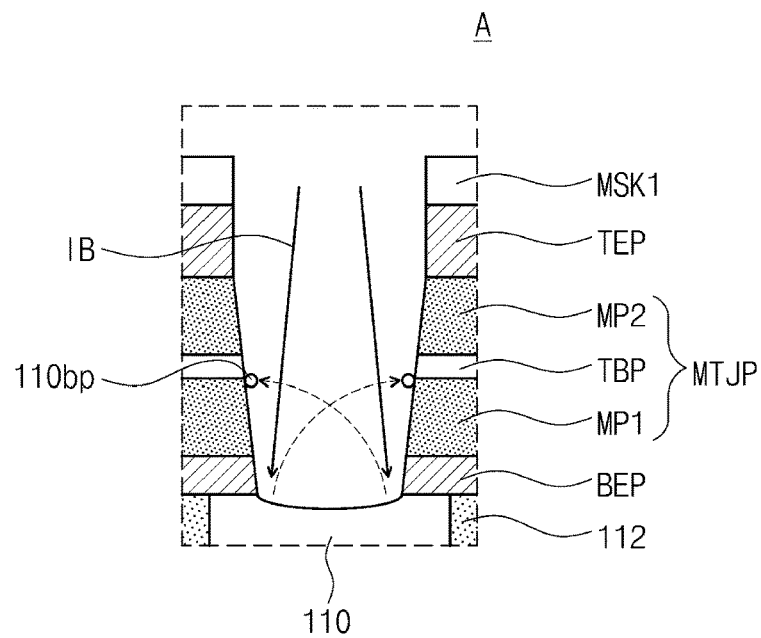
FIG. 4D is an enlarged view of section A shown in FIG. 4B.
Figure 4E:
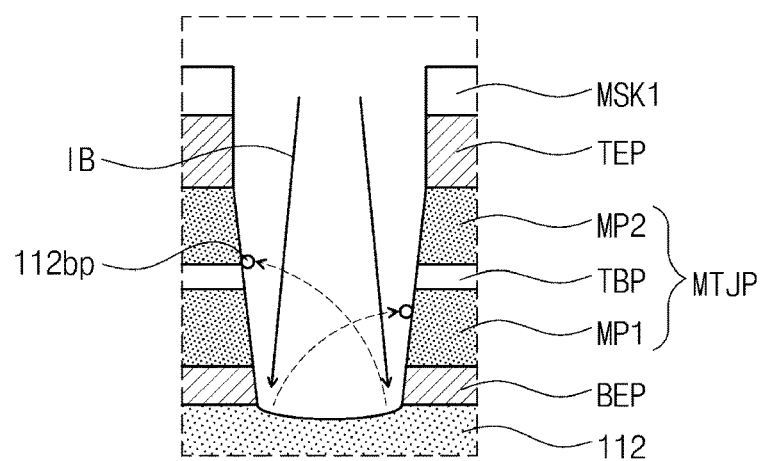
FIG. 4E is an enlarged view of section B shown in FIG. 4C.

FIG. 1 is a flow chart illustrating a method of fabricating a magnetic memory device according to exemplary embodiments of the present disclosure. FIGS. 2A to 12A are plan views illustrating a method of fabricating a magnetic memory device according to exemplary embodiments of the present disclosure. FIGS. 2B to 12B are cross-sectional views taken along line I-I' of FIGS. 2A to 12A, respectively. FIGS. 2C to 12C are cross-sectional views taken along line II-II' of FIGS. 2A to 12A, respectively. FIG. 4D is an enlarged view of section A shown in FIG. 4B. FIG. 4E is an enlarged view of section B shown in FIG. 4C.

Referring to FIGS. 1, 2A, 2B and 2C, a substrate 100 may be provided. The substrate 100 may include a semiconductor substrate. For example, the substrate 100 may include a silicon substrate, a germanium substrate, or a silicon-germanium substrate. Select elements (not shown) and/or lower interconnect lines (not shown) may be provided in and/or on the substrate 100. The select elements may be, for example, field effect transistors or diodes.

Figure 2A:
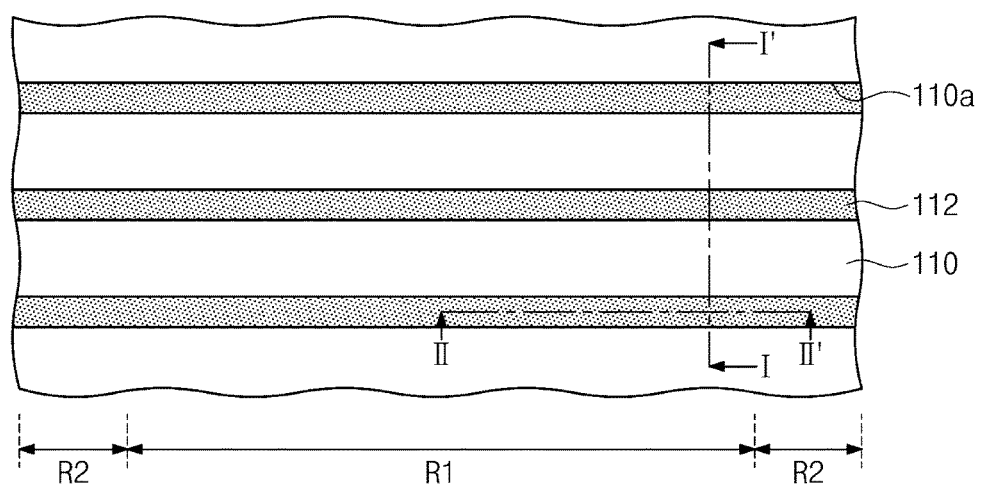
Figure 2A:
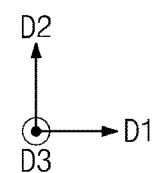
Figure 2B:
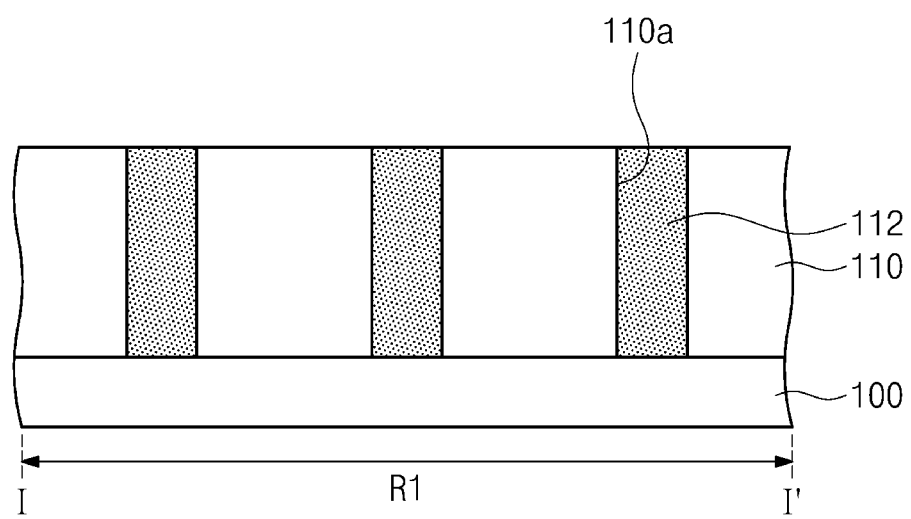
Figure 2B:
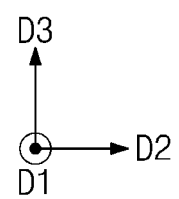
Figure 2C:
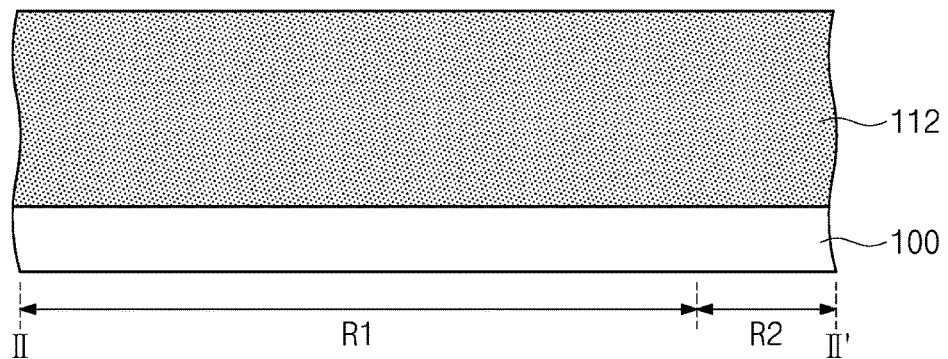
Figure 2C:
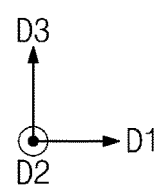

The substrate 100 may include a first region R1 and a second region R2. The first and second regions R1 and R2 may be adjacent to each other along a first direction D1 parallel to a top surface of the substrate 100. In some embodiments, the first region R1 and/or the second region R2 may be provided in plural. A plurality of first regions R1 and a plurality of second regions R2 may be disposed alternately along the first direction D1. It will be discussed below about embodiments where the substrate 100 includes a single first region R1 and two second regions R2 spaced apart from each other across the single first region R1, as shown in FIG. 2A. For example, one of the second regions R2 may be disposed at a first end of the first region R1 and the other one of the second regions R2 may be disposed at a second end of the first region R1 opposing the first end of the first region R1 in the first direction D1, as shown in FIG. 2A. The present disclosure is, however, not limited thereto.

A first interlayer dielectric layer 110 may be formed on the substrate 100 (S100). The first interlayer dielectric layer 110 may cover the first region R1 and the second regions R2, and further cover the select elements and/or the lower interconnect lines provided on the substrate 100. The first interlayer dielectric layer 110 may include an insulating material. For example, the first interlayer dielectric layer 110 may include silicon oxide, silicon nitride, and/or silicon oxynitride. The first interlayer dielectric layer 110 may be formed by, for example, a physical vapor deposition process or a chemical vapor deposition process.

Sacrificial patterns 112 may be formed in the first interlayer dielectric layer 110. Each of the sacrificial patterns 112 may extend along the first direction D1. Each of the sacrificial patterns 112 may thus extend from the first region R1 onto the second regions R2. The sacrificial patterns 112 may be spaced apart from each other along a direction (e.g., a second direction D2), which is parallel to the top surface of the substrate 100 and perpendicular to the first direction D1. The sacrificial patterns 112 may penetrate the first interlayer dielectric layer 110, and then be connected to the select elements and/or the lower interconnect lines. The formation of the sacrificial patterns 112 may include forming first trenches 110a extending along the first direction D1 in the first interlayer dielectric layer 110, forming a sacrificial layer (not shown) to fill the first trenches 110a, and performing a planarization process until a top surface of the first interlayer dielectric layer 110 is exposed.

The sacrificial patterns 112 may include an insulating material. The insulating material included in the sacrificial patterns 112 may exhibit an etch selectivity with respect to the first interlayer dielectric layer 110. For example, when the first interlayer dielectric layer 110 includes silicon oxide, the sacrificial patterns 112 may include silicon nitride. Alternatively, when the first interlayer dielectric layer 110 includes silicon nitride, the sacrificial patterns 112 may include silicon oxide.

Referring to FIGS. 1, 3A to 3C, and 4A to 4E, magnetic tunnel junction patterns MTJP may be formed on the sacrificial patterns 112 (S120).

First, referring to FIGS. 1, and 3A to 3C, a bottom electrode layer BEL, a magnetic tunnel junction layer MTJL, and a top electrode layer TEL may be sequentially formed on the first interlayer dielectric layer 110 and the sacrificial patterns 112. Each of the layers BEL, MTJL and TEL may be formed by, for example, a chemical vapor deposition process or a physical vapor deposition process.

The bottom electrode layer BEL may include, for example, conductive metal nitride such as titanium nitride and/or tantalum nitride. The top electrode layer TEL may include, for example, tungsten, tantalum, aluminum, copper, gold, silver, titanium, and/or conductive nitride thereof (e.g., conductive metal nitride). In some embodiments, at least one of the bottom electrode layer BEL or the top electrode layer TEL may be omitted. It will be discussed below about embodiments where the bottom and top electrode layers BEL and TEL are formed, but the present disclosure is not limited thereto.

The magnetic tunnel junction layer MTJL may include a first magnetic layer ML1, a tunnel barrier layer TBL, and a second magnetic layer ML2 that are sequentially stacked on the bottom electrode layer BEL. For example, the tunnel barrier layer TBL is provided between the first magnetic layer ML1 and the second magnetic layer ML2. In some embodiments, the bottom electrode layer BEL, the magnetic tunnel junction layer MTJL, and the top electrode layer TEL in combination may form a magnetic structure. For example, the magnetic structure may be formed by sequentially depositing the bottom electrode layer BEL, the first magnetic layer ML1, the tunnel barrier layer TBL, the second magnetic layer ML2, and the top electrode layer TEL.

However, the disclosure is not limited thereto. For example, in some embodiments, at least one of the bottom electrode layer BEL or the top electrode layer TEL may be omitted.

The tunnel barrier layer TBL may include at least one of oxide of magnesium (Mg), oxide of titanium (Ti), oxide of aluminum (Al), oxide of magnesium-zinc (MgZn), oxide of magnesium-boron (MgB), nitride of titanium (Ti), and nitride of vanadium (V). For example, the tunnel barrier layer TBL may be a single layer of magnesium oxide (MgO). Alternatively, the tunnel barrier layer TBL may include a plurality of layers. The tunnel barrier layer TBL may be formed by a process of chemical vapor deposition (CVD).

The magnetic tunnel junction layer MTJL will be further discussed below with reference to FIGS. 15A and 15B.

First mask patterns MSK1 may be formed on the top electrode layer TEL. The first mask patterns MSK1 may be formed on the first region R1, but not on the second regions R2. The first mask patterns MSK1 may form a plurality of rows extending along the first direction D1. As viewed in plan, the plurality of rows may correspond to the sacrificial patterns 112. For example, as viewed in plan, the first mask patterns MSK1 included in each of the plurality of rows overlap a corresponding sacrificial pattern 112. The first mask patterns MSK1 may also form a plurality of columns extending along the second direction D2, which is parallel to the top surface of the substrate 100 and crosses the first direction D1. In some embodiments, as shown in FIG. 3A, the second direction D2 may be substantially perpendicular to the first direction D1. The present disclosure, however, is not limited thereto. The first mask patterns MSK1 may define positions where magnetic tunnel junction patterns MTJP are formed, which will be described below.

Next, referring to FIGS. 1 and 4A to 4E, the top electrode layer TEL, the magnetic tunnel junction layer MTJL, and the bottom electrode layer BEL may be sequentially patterned using the first mask patterns MSK1 as an etching mask. Accordingly, bottom electrode patterns BEP, magnetic tunnel junction patterns MTJP, and top electrode patterns TEP sequentially stacked on the first region R1 may be formed.

Each of the magnetic tunnel junction patterns MTJP may include first and second magnetic patterns MP1 and MP2, one of which may correspond to a reference pattern having a unidirectionally fixed magnetization direction, and the other of which may correspond to a free pattern having a magnetization direction that can be changed parallel or anti-parallel to the magnetization direction of the reference pattern. The above description will be further explained below with reference to FIGS. 15A and 15B.

The magnetic tunnel junction patterns MTJP may form a plurality of rows extending along the first direction D1. As viewed in plan, the magnetic tunnel junction patterns MTJP included in each of the plurality of rows overlap a corresponding sacrificial pattern 112. The magnetic tunnel junction patterns MTJP may also form a plurality of columns extending along the second direction D2.

Each of the magnetic tunnel junction patterns MTJP may have a width MTJP_W in a direction perpendicular to the first direction D1, and each of the sacrificial patterns 112 may have a width 112_W in a direction perpendicular to the first direction D1. In some embodiments, the width MTJP_W may be greater than the width 112_W. Therefore, as viewed in plan, each of the magnetic tunnel junction patterns MTJP may partially overlap the first interlayer dielectric layer 110.

The patterning of the magnetic tunnel junction layer MTJL and the bottom electrode layer BEL may be performed using an ion beam etching process. The ion beam etching process may irradiate an ion beam IB onto the magnetic tunnel junction layer MTJL and the bottom electrode layer BEL, thereby patterning the magnetic tunnel junction layer MTJL and the bottom electrode layer BEL. The ion beam etching process may be carried out until top surfaces of the first interlayer dielectric layer 110 and the sacrificial patterns 112 are exposed.

To reliably separate the magnetic tunnel junction patterns MTJP from each other and/or the bottom electrode patterns BEP from each other, the ion beam etching process may be performed until partially etching the first interlayer dielectric layer 110 and the sacrificial patterns 112 that are exposed to external. During the separating process, the first interlayer dielectric layer 110 may produce etching byproducts 110bp and the sacrificial patterns 112 may likewise produce etching byproducts 112bp. The etching byproducts 110bp and 112bp may be re-deposited on sidewalls of the magnetic tunnel junction patterns MTJP. However, according to the exemplary embodiments of the present disclosure, the magnetic tunnel junction patterns MTJP may be free of short caused by the etching byproducts 110bp and 112bp of the first interlayer dielectric layer 110 and the sacrificial patterns 112 because all of the first interlayer dielectric layer 110 and the sacrificial patterns 112 include insulating material.

Referring to FIGS. 1, 5A to 5C, and 6A to 6C, a capping pattern 122 may be formed to cover the magnetic tunnel junction patterns MTJP (S130).

First, referring to FIGS. 1 and 5A to 5C, a capping layer 120 may be formed to cover the magnetic tunnel junction patterns MTJP. The capping layer 120 may be formed to cover entire surfaces of the first and second regions R1 and the R2. For example, the capping layer 120 may be a single or multiple layer covering the entire surfaces of the first and second regions R1 and R2. The capping layer 120 may include a material having an etch selectivity with respect to the sacrificial patterns 112. For example, when the sacrificial patterns 112 include silicon oxide, the capping layer 120 may include silicon nitride. Alternatively, when the sacrificial patterns 112 include silicon nitride, the capping layer 120 may include silicon oxide. The capping layer 120 may be formed by, for example, a chemical vapor deposition process or a physical vapor deposition process.

Figure 5A:
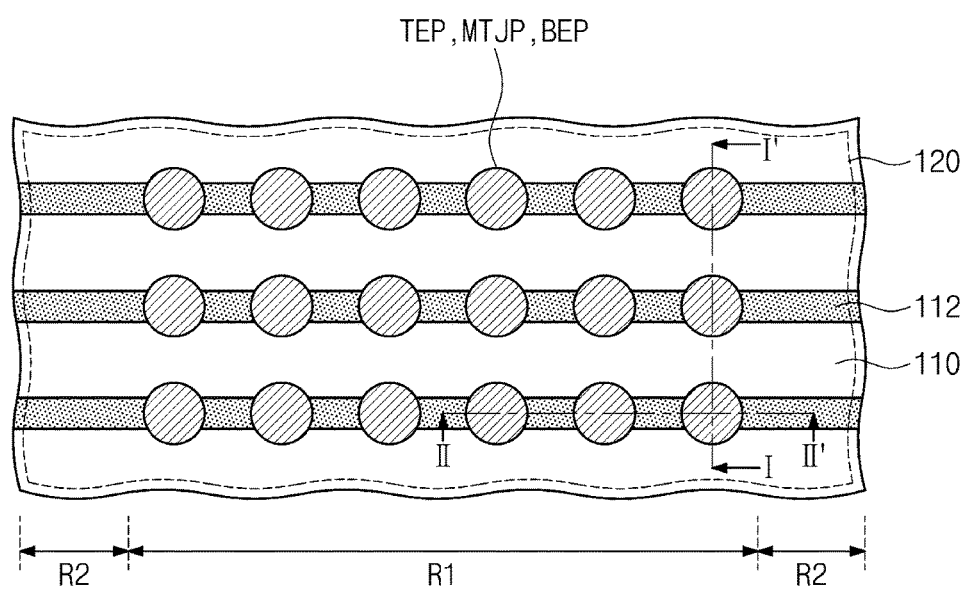
Figure 5A:
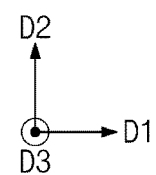
Figure 5B:
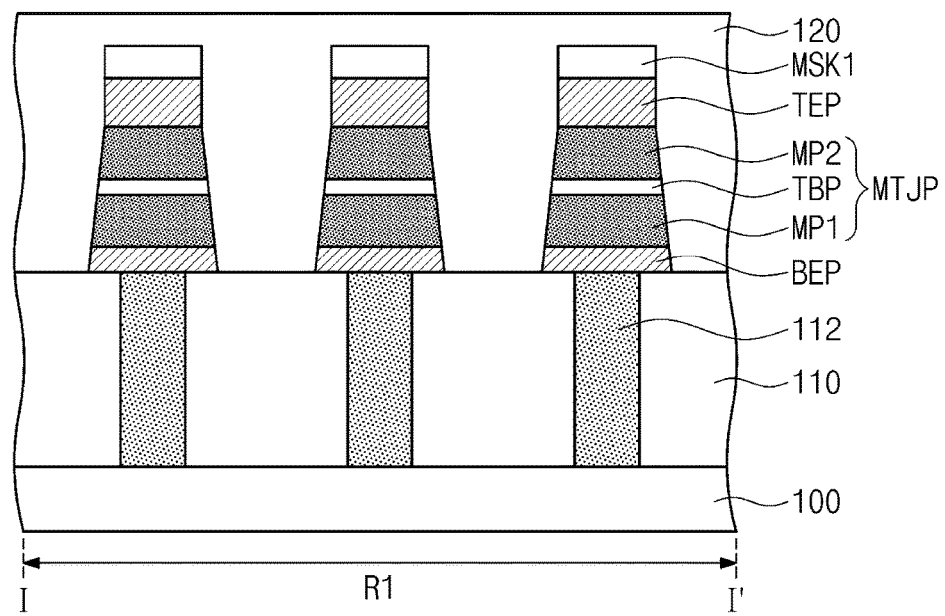
Figure 5B:
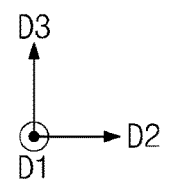
Figure 5C:
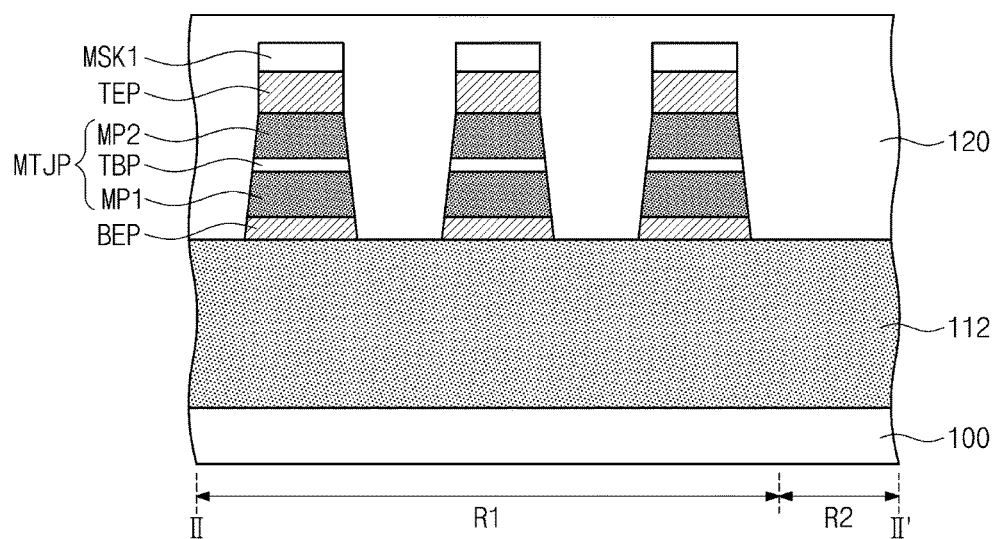
Figure 5C:
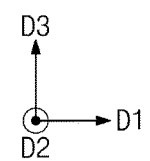
Figure 6A:
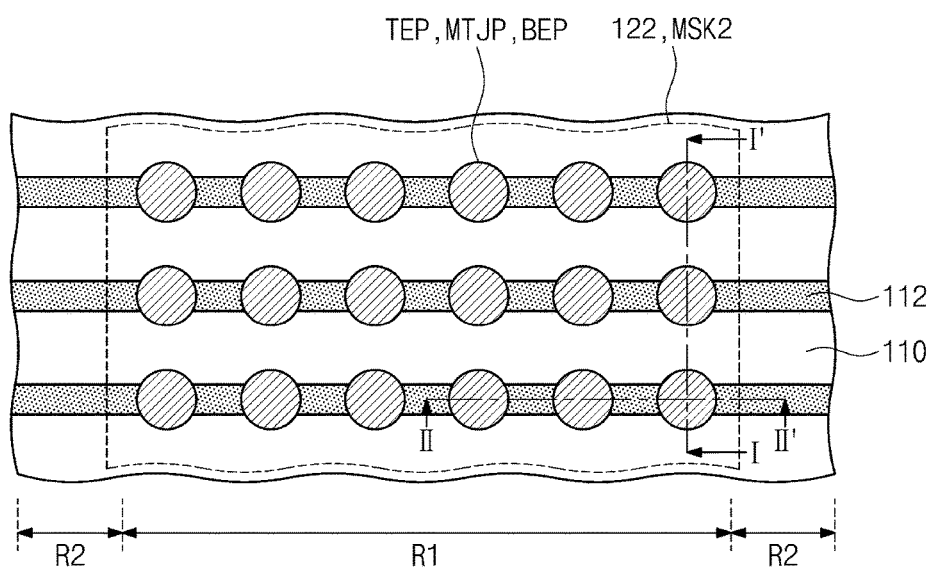
Figure 6A:
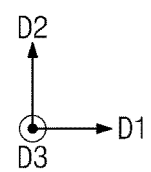
Figure 6B:
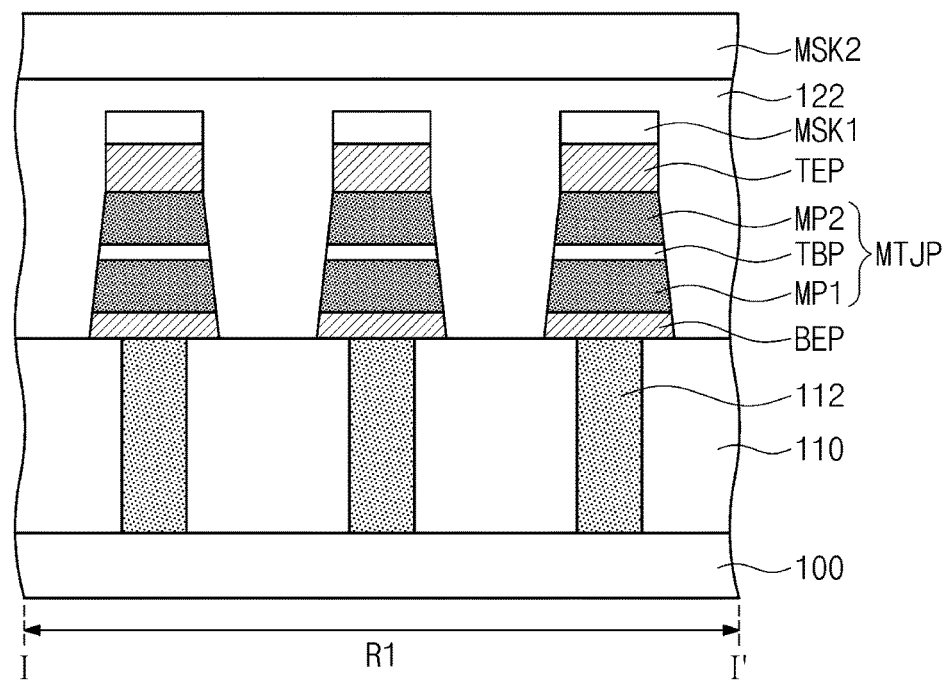
Figure 6B:
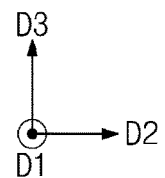
Figure 6C:
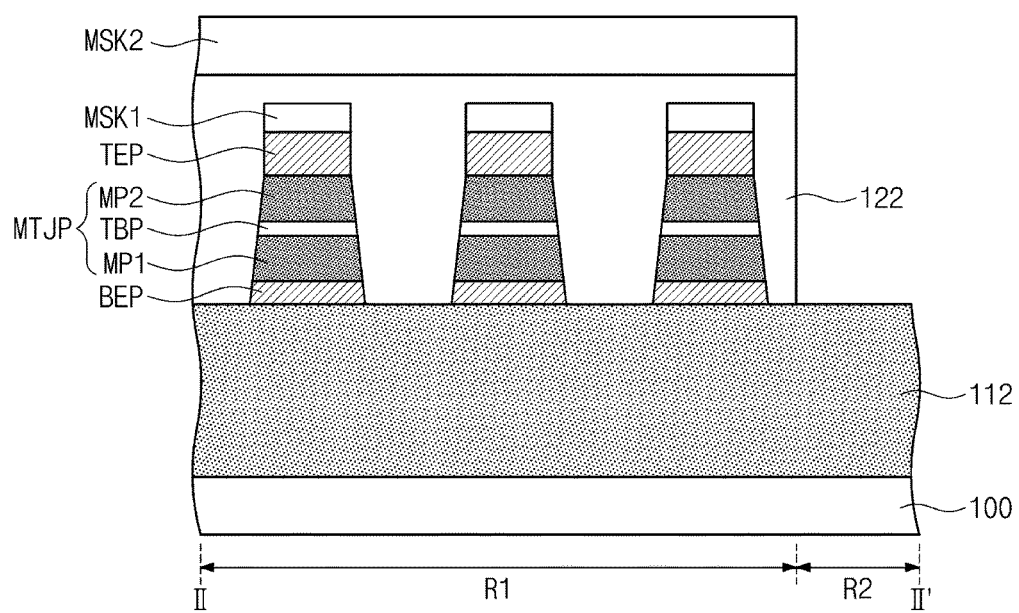
Figure 6C:
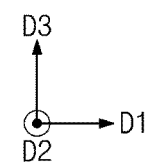
Figure 7A:
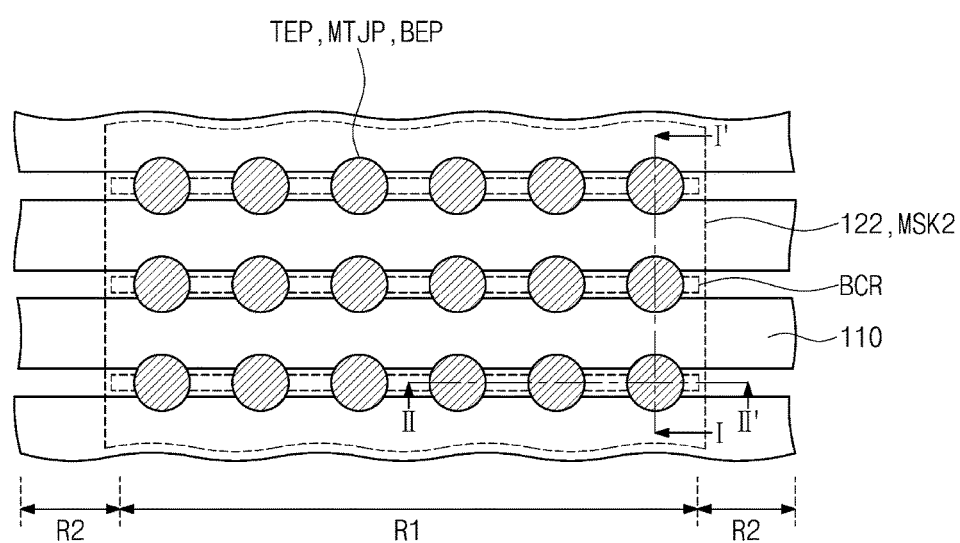
Figure 7A:
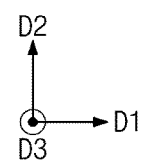
Figure 7B:
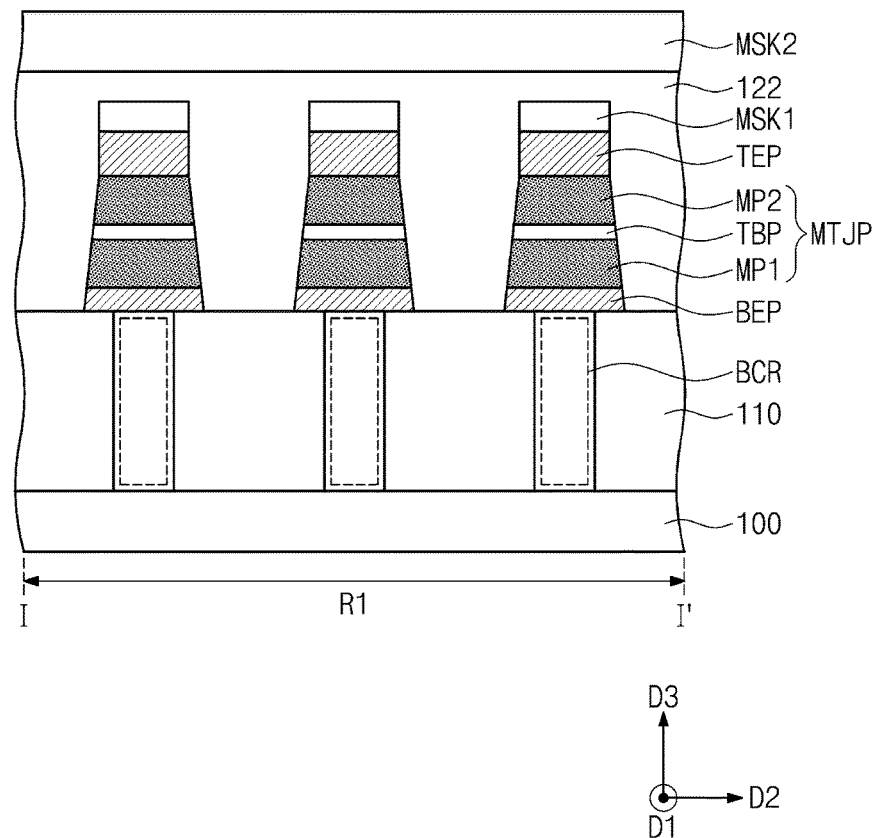
Figure 7C:
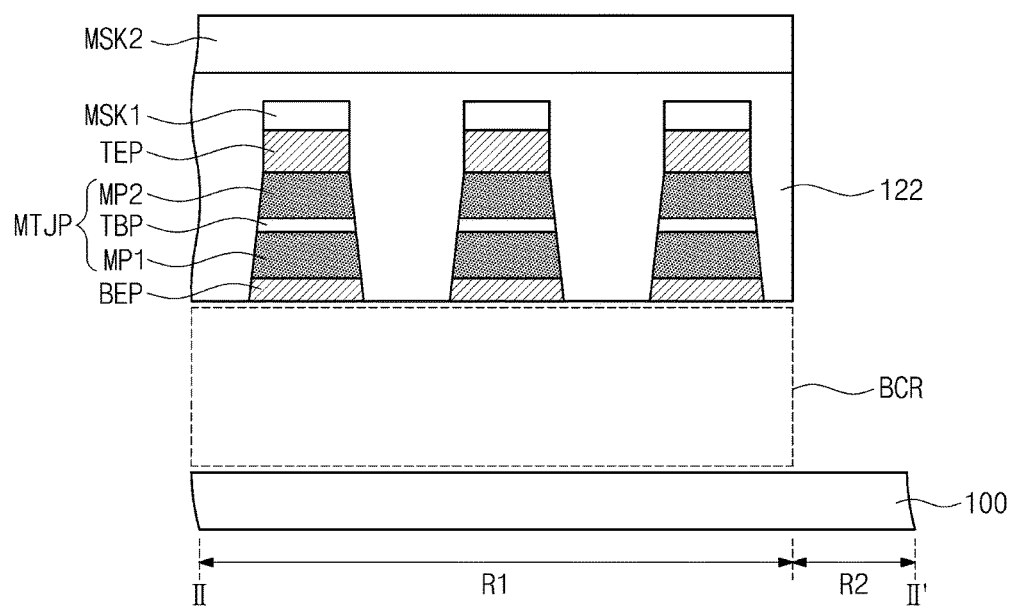

In some embodiments, as shown in FIGS. 5A to 5C, the capping layer 120 may be formed to have a thickness which is high enough to fill spaces between the magnetic tunnel junction patterns MTJP. The present disclosure, however, is not limited thereto. In other embodiments, unlike those shown in FIGS. 5A to 5C, the capping layer 120 may be formed to conformally cover a structure formed on the substrate 100.

Next, referring to FIGS. 1 and 6A to 6C, the capping pattern 122 may be formed to expose the sacrificial patterns 112 on the second regions R2. For example, the capping pattern 122 may be formed on the first region R1 to cover the magnetic tunnel junction patterns MTJP while exposing the first interlayer dielectric layer 110 and the sacrificial patterns 112 on the second regions R2. The formation of the capping pattern 122 may include forming on the capping layer 120 a second mask pattern MSK2 through which the second regions R2 are exposed and then patterning the capping layer 120 using the second mask pattern MSK2 as an etching mask.

Referring to FIGS. 1 and 7A to 7C, the sacrificial patterns 112 may be selectively removed to form bottom contact regions BCR (S140). The selective removal of the sacrificial patterns 112 may include performing a wet etching process.

As the sacrificial patterns 112 may include a material having an etch selectivity with respect to the first interlayer dielectric layer 110 and the capping pattern 122, the wet etching process may not substantially etch the first interlayer dielectric layer 110 and the capping pattern 122.

The bottom contact regions BCR may be defined indicating areas where the sacrificial patterns 112 are removed from on the first region R1. As viewed in plan, each of the bottom contact regions BCR may extend along the first direction D1, and may correspond to one of rows consisting of the magnetic tunnel junction patterns MTJP. As viewed in cross-section, the bottom contact regions BCR may be hollow spaces between the substrate 100 and rows consisting of the magnetic tunnel junction patterns MTJP.

Referring to FIGS. 1 and 8A to 8C, preliminary bottom contacts BCT_p may be formed to fill the bottom contact regions BCR (S150). The formation of the preliminary bottom contacts BCT_p may include depositing a bottom contact layer (not shown) to fill the bottom contact regions BCR and removing the bottom contact layer deposited outside the bottom contact regions BCR.

The bottom contact layer may be formed using a chemical vapor deposition process. The bottom contact layer may fill the bottom contact regions BCR. The bottom contact layer may also be formed on the second regions R2 and/or the second mask pattern MSK2. The bottom contact layer may include at least one of, for example, a doped semiconductor material (e.g., doped silicon), metal (e.g., tungsten and/or copper), conductive metal nitride (e.g., titanium nitride, tantalum nitride, and/or tungsten nitride), or metal-semiconductor compound (e.g., metal silicide).

Figure 8A:
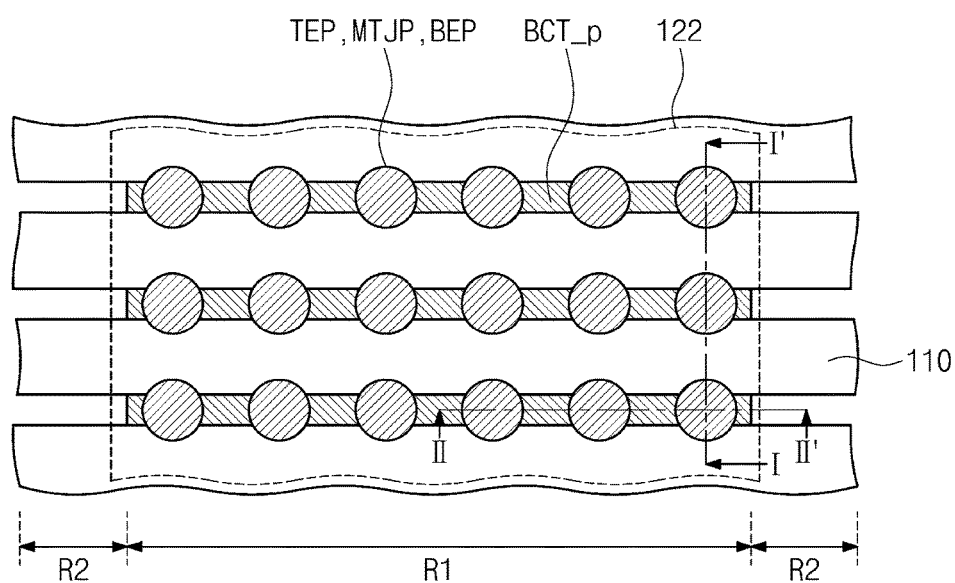
Figure 8A:
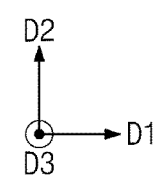
Figure 8B:
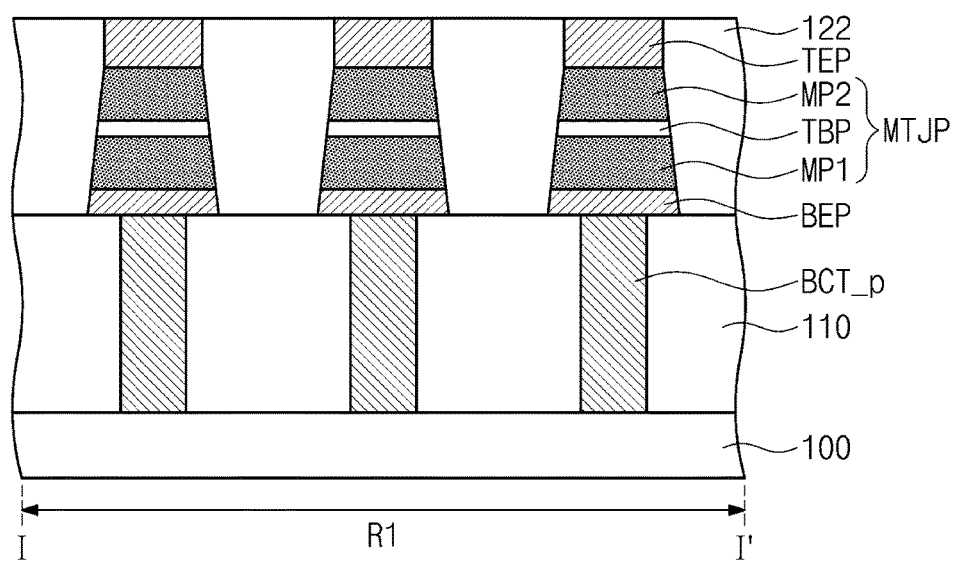
Figure 8B:
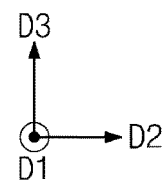
Figure 8C:
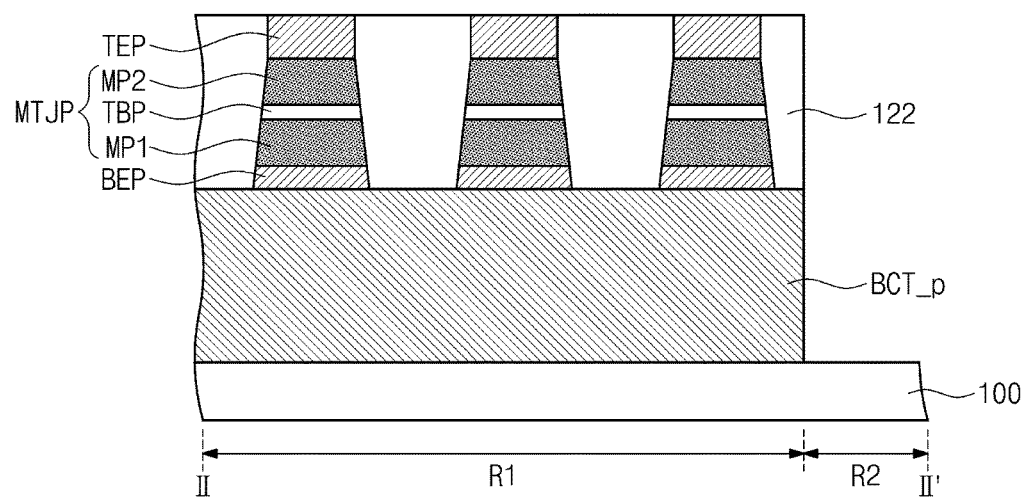
Figure 8C:
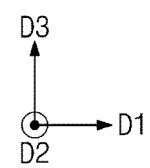
Figure 9A:
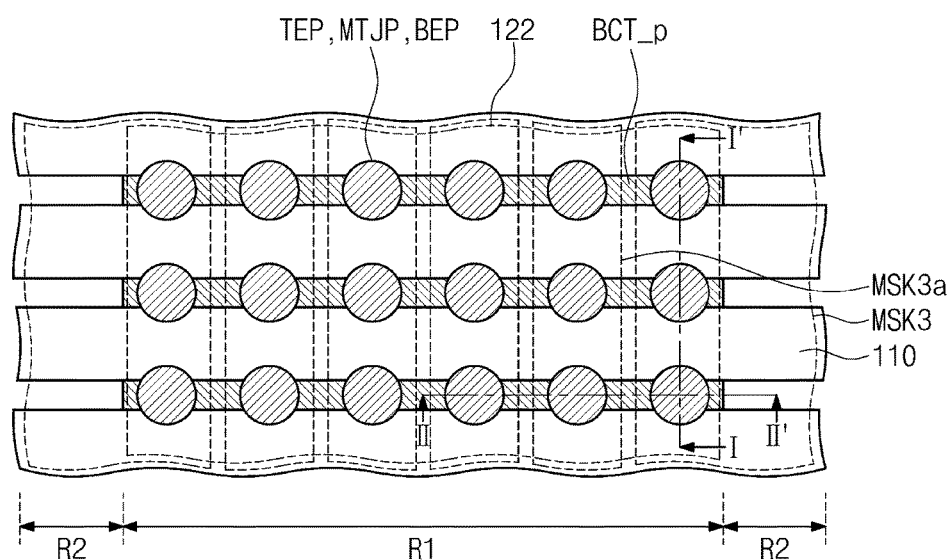
Figure 9A:
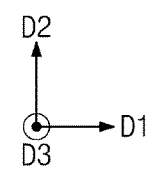
Figure 9B:
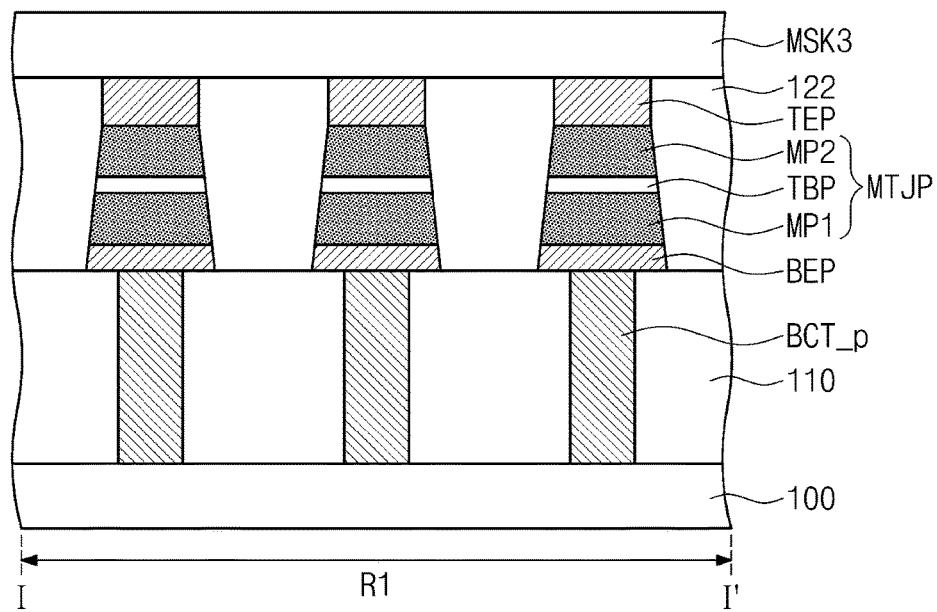
Figure 9B:
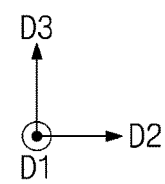
Figure 9C:
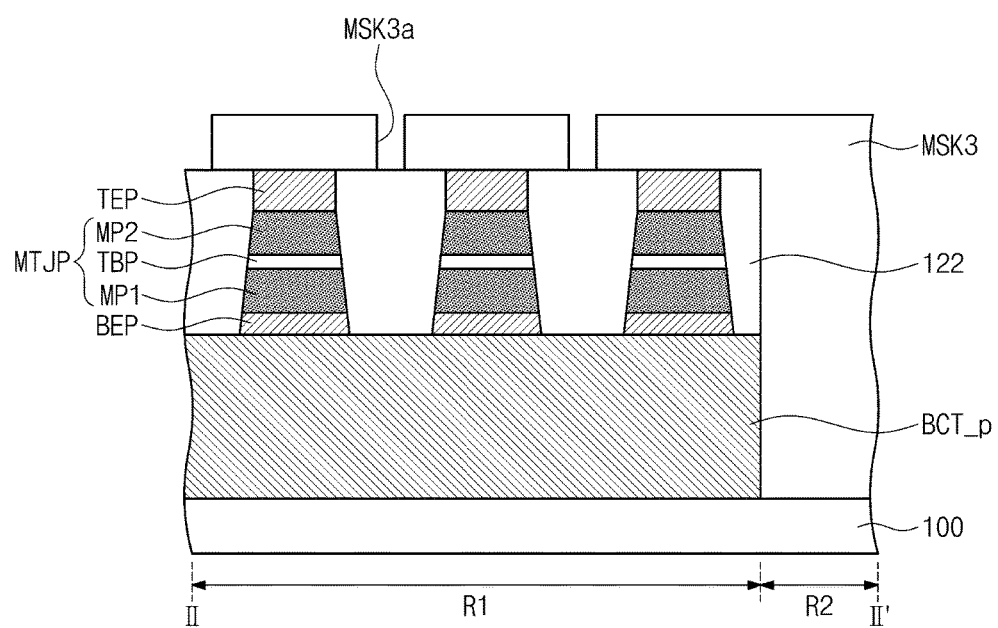

An etch-back process may be performed to remove the bottom contact layer deposited outside the bottom contact regions BCR. Thus, the preliminary bottom contacts BCT_p may be locally formed in the bottom contact regions BCR. The etch-back process may include a chemical mechanical polishing process and/or a dry etching process. The etch-back process may remove the second mask pattern MSK2. In some embodiments, as shown in FIGS. 8B and 8C, the etch-back process may also remove the first mask patterns MSK1. The present disclosure is, however, not limited thereto.

Referring to FIGS. 1, 9A to 9C, and 10A to 10C, the preliminary bottom contacts BCT_p may be patterned to form bottom contacts BCT (S160). The formation of the bottom contacts BCT may include forming a third mask pattern MSK3 and patterning the preliminary bottom contacts BCT_p using the third mask pattern MSK3 as an etching mask.

First, referring to FIGS. 1 and 9A to 9C, the third mask pattern MSK3 may be formed on the capping pattern 122. The third mask pattern MSK3 may include openings MSK3a extending along the second direction D2. The openings MSK3a may be spaced apart from each other in the first direction D1. As viewed in plan, the openings MSK3a may be positioned between columns each comprising the magnetic tunnel junction patterns MTJP. For example, as viewed in plan, the openings MSK3a and the columns each comprising the magnetic tunnel junction patterns MTJP may be arranged alternately and repeatedly.

Next, referring to FIGS. 1 and 10A to 10C, the bottom contacts BCT may be formed by patterning the preliminary bottom contacts BCT_p using the third mask pattern MSK3 as an etching mask. The patterning process may separate each of the preliminary bottom contacts BCT_p into the bottom contacts BCT spaced apart from each other in the first direction D1. The bottom contacts BCT may be formed to correspond to the magnetic tunnel junction patterns MTJP respectively. As a result, each of the bottom contacts BCT may be formed below its corresponding magnetic tunnel junction pattern MTJP. The bottom contacts BCT may electrically connect the magnetic tunnel junction patterns MTJP to the select elements and/or the lower interconnect lines formed on the substrate 100. Each of the select elements may be configured to selectively control the flow of charges passing through a corresponding magnetic tunnel junction pattern MTJP. For example, the select element may be one of a diode, a PNP bipolar transistor, an NPN bipolar transistor, an NMOS field effect transistor, and a PMOS field effect transistor.

The capping pattern 122 may also be patterned during the patterning of the preliminary bottom contacts BCT_p. The capping pattern 122 may therefore be separated into sub-capping patterns 124 spaced apart from each other in the first direction D1. As viewed in plan, each of the sub-capping patterns 124 may extend along the second direction D2.

Each of separation spaces 124sr between the sub-capping patterns 124 may be spatially connected to its corresponding one of separation spaces BCTsr between the bottom contacts BCT, and thereby a gap region GR may be defined. As viewed in plan, the gap regions GR may be spaced apart from each other along the first direction D1.

Figure 10A:
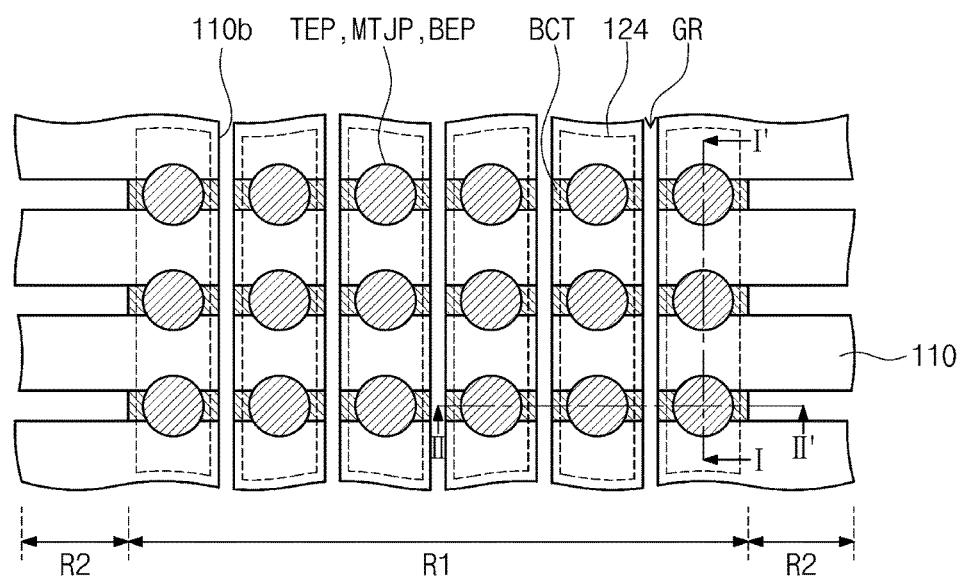
Figure 10A:
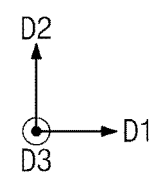
Figure 10B:
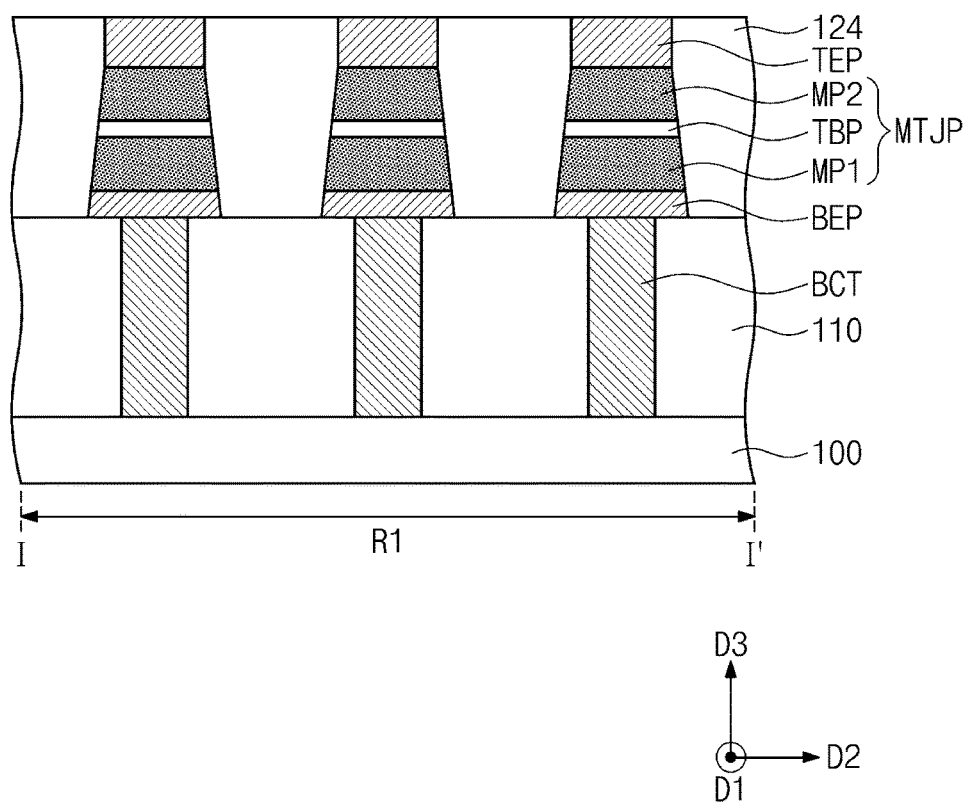
Figure 10C:
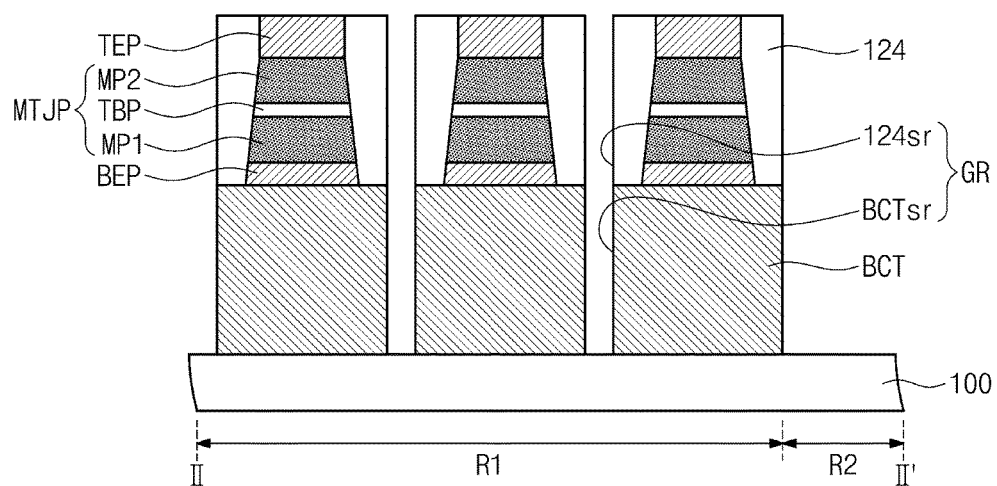
Figure 10C:
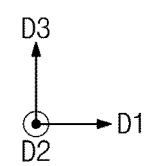

In some embodiments, as shown in FIG. 10A, the first interlayer dielectric layer 110 may also be patterned during the patterning of the preliminary bottom contacts BCT_p. For these embodiments, the first interlayer dielectric layer 110 may be patterned to include second trenches 110b extending along the second direction D2. In these cases, each of the gap regions GR may include its corresponding second trench 110b.

In other embodiments, unlike that shown in FIG. 10A, the first interlayer dielectric layer 110 may not substantially be patterned during the patterning of the preliminary bottom contacts BCT_p.

After the bottom contacts BCT are formed, the third mask pattern MSK3 may be removed.

Referring to FIGS. 1 and 11A to 11C, a second interlayer dielectric layer 130 may be formed (S170). The second interlayer dielectric layer 130 may fill the first trenches 110a on the second regions R2. In addition, the second interlayer dielectric layer 130 may cover the sub-capping patterns 124. The second interlayer dielectric layer 130 may include, for example, silicon oxide, silicon nitride, and/or silicon oxynitride.

Figure 11A:
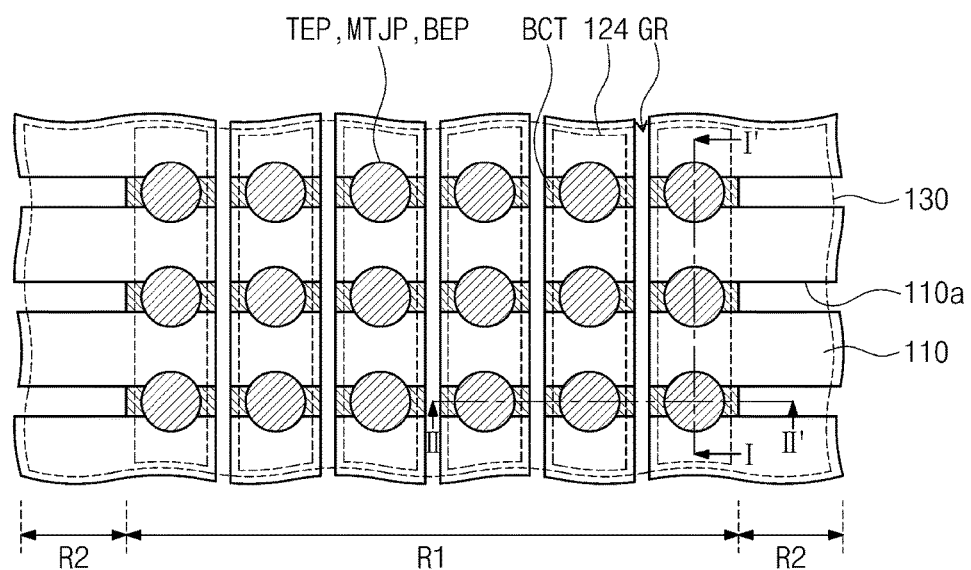
Figure 11A:
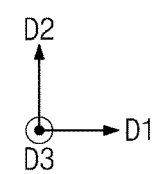
Figure 11B:
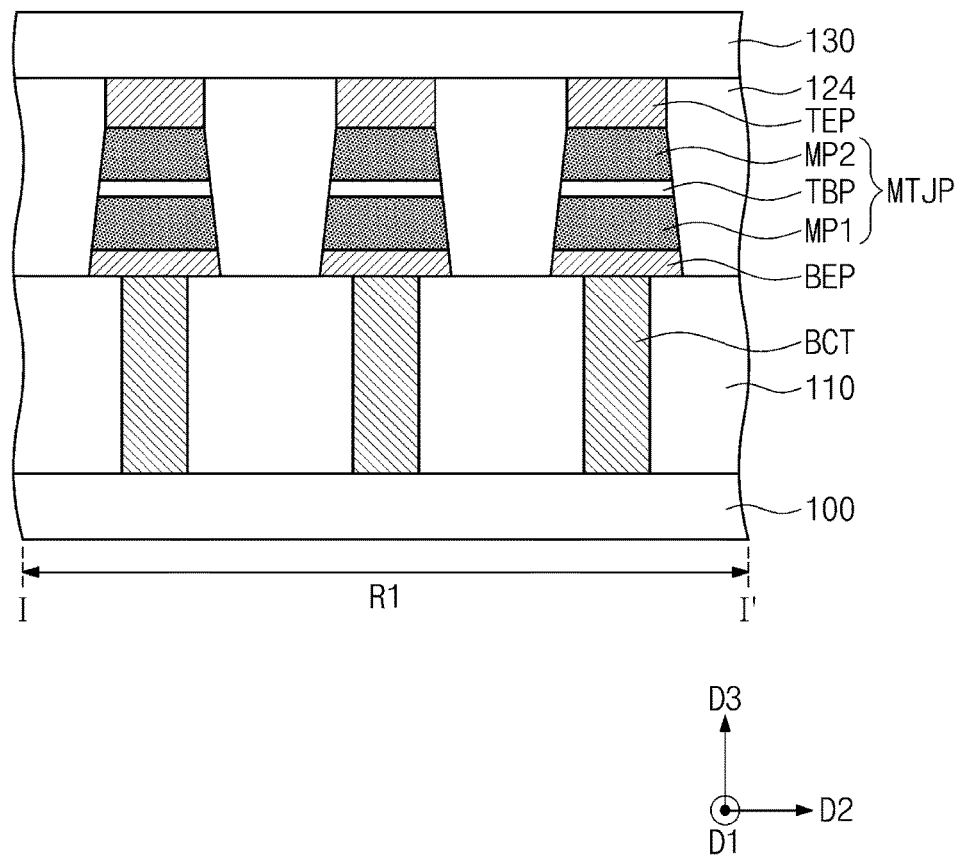
Figure 11C:
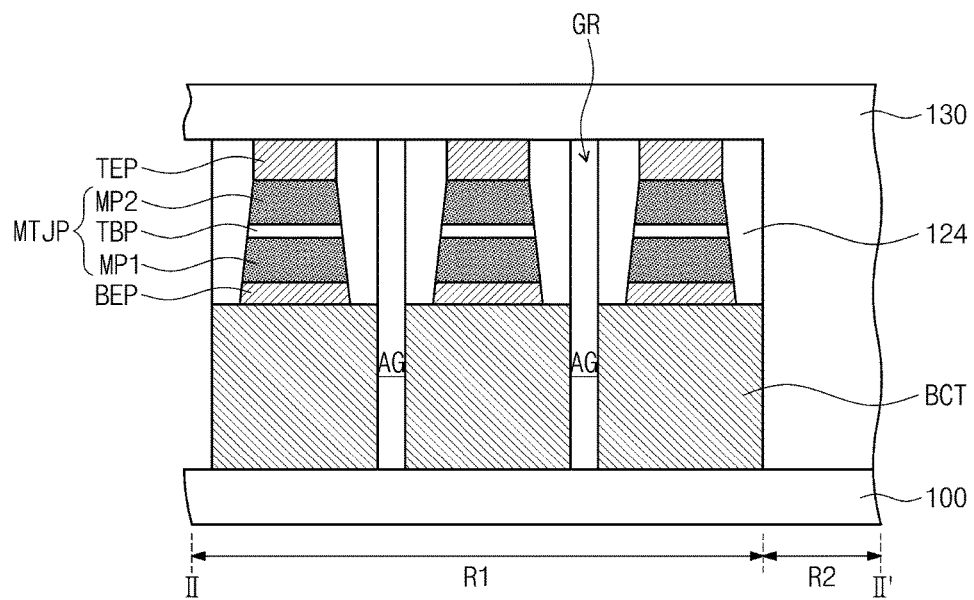
Figure 11C:
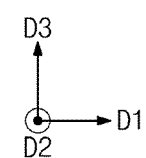

In some embodiments, as shown in FIG. 11C, the second interlayer dielectric layer 130 may be formed not to fill the gap region GR. That is, the second interlayer dielectric layer 130 may be formed to extend over the gap region GR. In this configuration, an air gap AG may be formed between the bottom contacts BCT. The term "air" as discussed herein, may refer to atmospheric air, or other gases that may be present during the manufacturing process. The air gap AG may have a dielectric constant less than those of the first and second interlayer dielectric layers 110 and 130. It thus may be possible to reduce parasitic capacitance between the bottom contacts BCT. In the embodiments above, the second interlayer dielectric layer 130 may be formed using a deposition process exhibiting poor step coverage characteristics.

In other embodiments, unlike that shown in FIG. 11C, the second interlayer dielectric layer 130 may be formed to fill the gap region GR. In these embodiments, the second interlayer dielectric layer 130 may be formed using a deposition process exhibiting good step coverage characteristics.

Figure 12A:
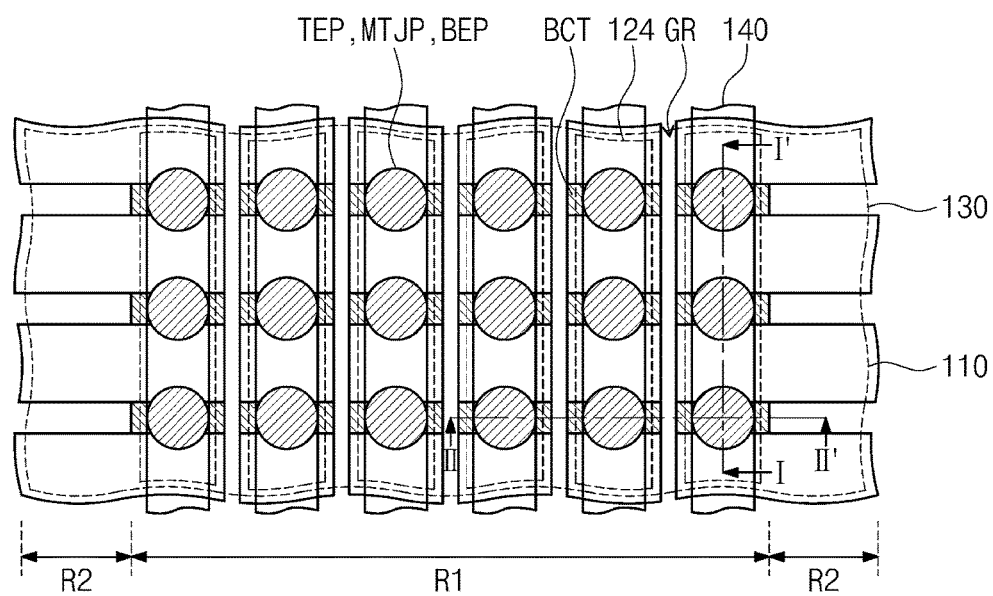
Figure 12A:
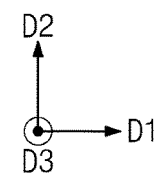
Figure 12B:
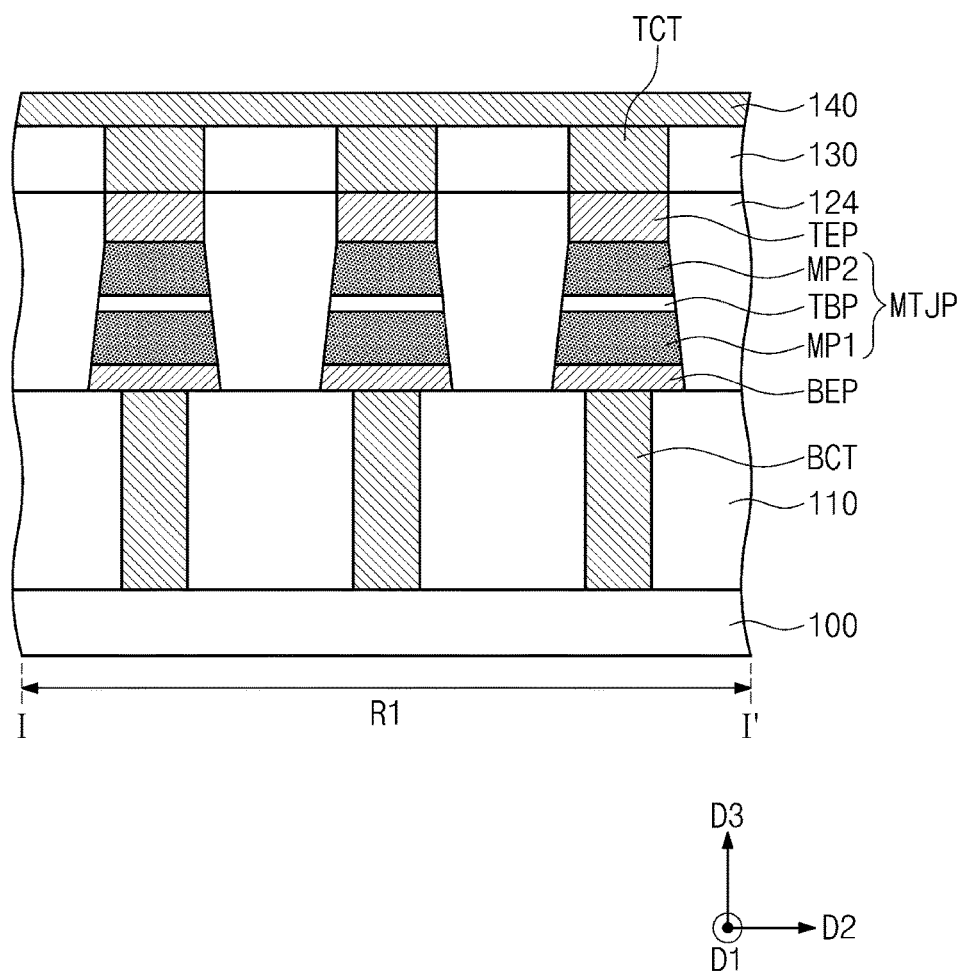
Figure 12C:
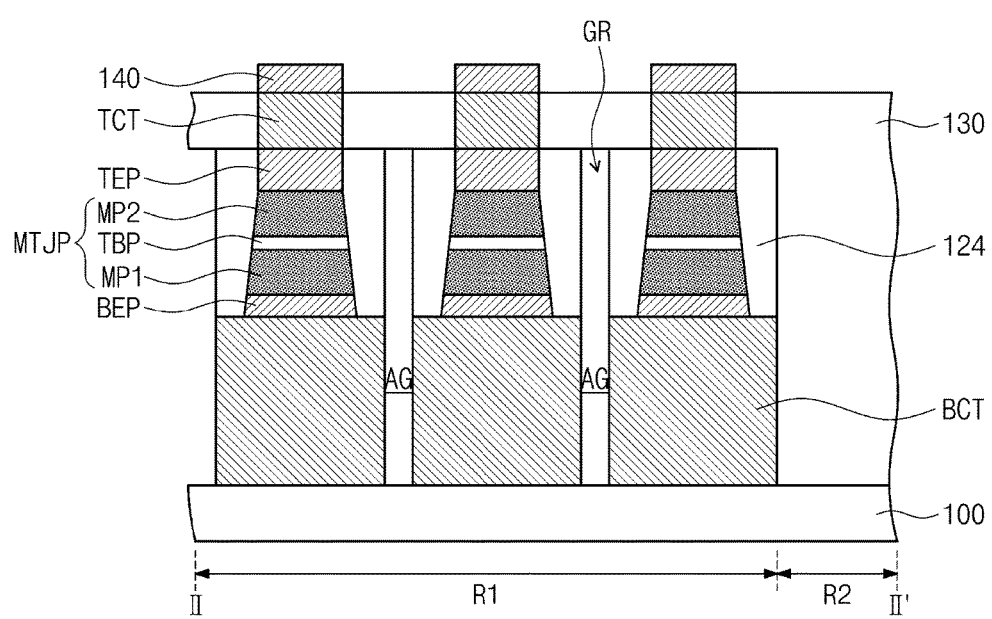
Figure 12C:
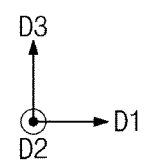

Referring to FIGS. 12A to 12C, top contacts TCT may be formed to penetrate the second interlayer dielectric layer 130, and thus be electrically connected to the top electrode patterns TEP. The top contacts TCT may include at least one of, for example, a doped semiconductor material, metal, conductive metal nitride, or metal-semiconductor compound.

Interconnect lines 140 may be formed on the second interlayer dielectric layer 130. The interconnect lines 140 may include at least one of, for example, a doped semiconductor material, metal, conductive metal nitride, or metal-semiconductor compound.

In some embodiments, as shown in FIGS. 12A to 12C, each of the interconnect lines 140 may extend along the second direction D2. In these embodiments, each of the interconnect lines 140 may be commonly connected to a plurality of magnetic tunnel junction patterns MTJP arranged along the second direction D2, i.e., the magnetic tunnel junction patterns MTJP constituting one column.

In other embodiments, unlike those shown in FIGS. 12A to 12C, each of the interconnect lines 140 may extend along the first direction D1. In the embodiments above, each of the interconnect lines 140 may be commonly connected to a plurality of magnetic tunnel junction patterns MTJP arranged along the first direction D1, i.e., the magnetic tunnel junction patterns MTJP constituting one row.

If patterning of the magnetic tunnel junction layer is performed after forming of the bottom contacts, the bottom contacts may be exposed and partially etched during the patterning of the magnetic tunnel junction layer. The magnetic tunnel junction pattern may therefore suffer from short problem because etching byproducts produced from the bottom contacts may be re-deposited on sidewalls of the magnetic junction pattern.

According to exemplary embodiments of the present disclosure, after patterning of the magnetic tunnel junction layer MTJL is done, the sacrificial patterns 112 may be replaced by the bottom contacts BCT. That is, according to the exemplary embodiments, the bottom contacts BCT may be formed after the magnetic tunnel junction layer MTJL is patterned. The first interlayer dielectric layer 110 and the sacrificial patterns 112 may be exposed and partially etched during the patterning of the magnetic tunnel junction layer MTJL. However, even when the etching byproducts (see 110bp and 112bp of FIGS. 4D and 4E) of the first interlayer dielectric layer 110 and the sacrificial patterns 112 are re-deposited on sidewalls of the magnetic tunnel junction patterns MTJP, the magnetic tunnel junction patterns MTJP may be free of short because all of the first interlayer dielectric layer 110 and the sacrificial patterns 112 include an insulating material. Thus, according to exemplary embodiments of the present disclosure, it may be possible to fabricate a magnetic memory device having enhanced reliability.

FIGS. 13A to 14A are plan views illustrating a method of fabricating a magnetic memory device according to exemplary embodiments of the present disclosure. FIGS. 13B and 14B are cross-sectional views taken along line I-I' of FIGS. 13A and 14A, respectively. FIGS. 13C and 14C are cross-sectional views taken along line II-II' of FIGS. 13A and 14A, respectively. Components substantially the same as or similar to those discussed with reference to FIGS. 1, 2A to 12A, 2B to 12B, and 2C to 12C may be allocated the same reference numerals thereto. It will be hereinafter principally described about different configurations from those discussed with reference to FIGS. 1, 2A to 12A, 2B to 12B, and 2C to 12C.

Figure 13A:
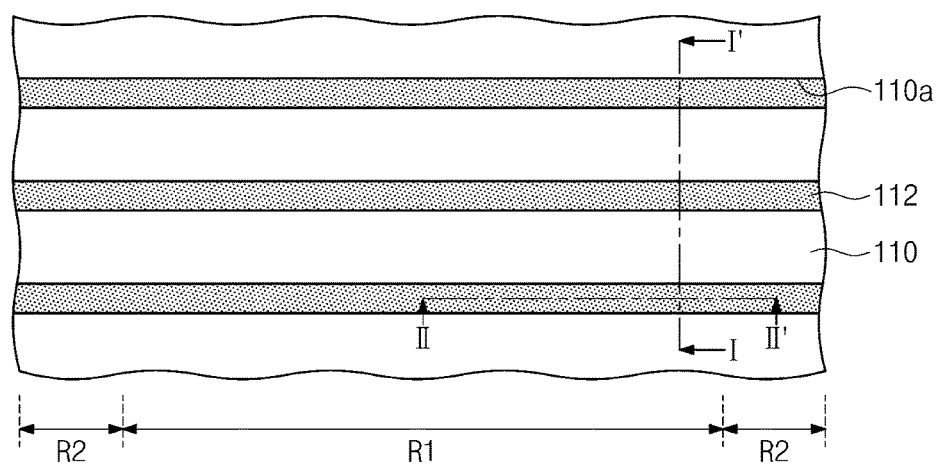
FIGS. 13A and 14A are plan views illustrating a method of fabricating a magnetic memory device according to exemplary embodiments of the present disclosure.
Figure 13A:
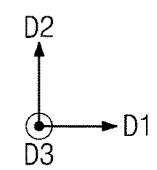
Figure 13B:
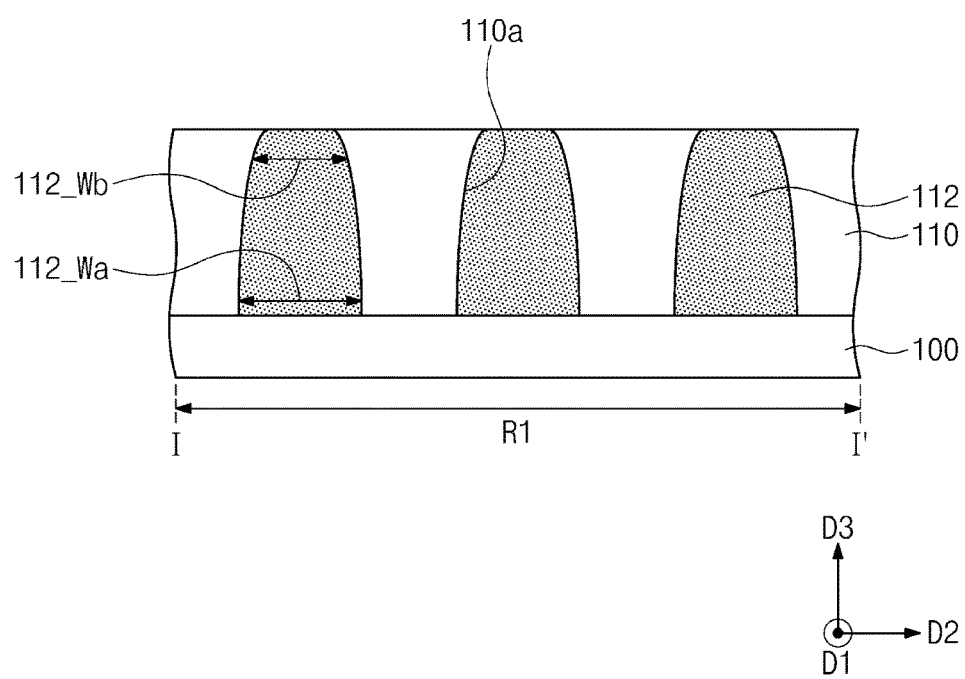
FIGS. 13B and 14B are cross-sectional views taken along line I-I' of FIGS. 13A and 14A, respectively.
Figure 13C:
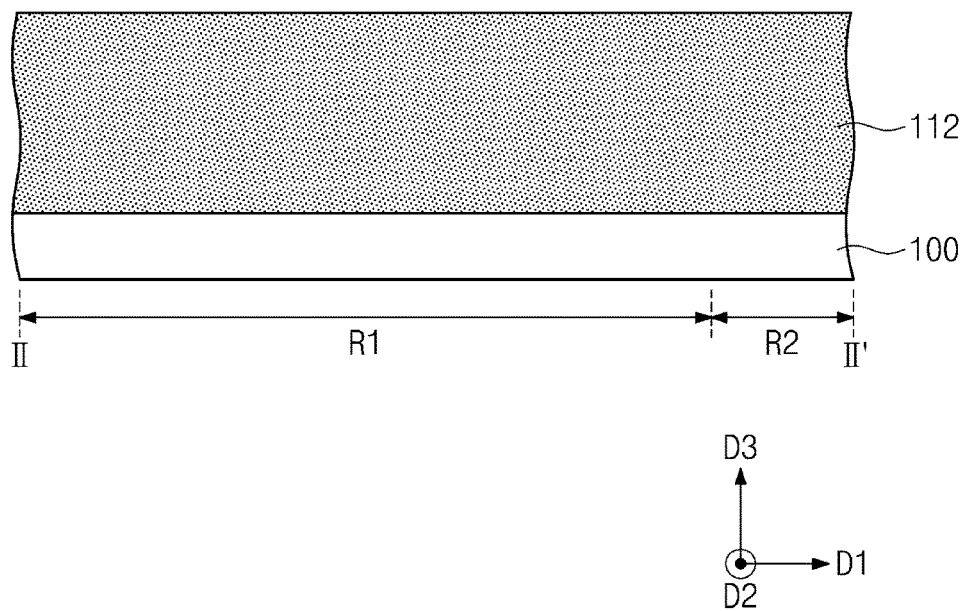
FIGS. 13C and 14C are cross-sectional views taken along line II-II' of FIGS. 13A and 14A, respectively.

Referring to FIGS. 13A to 13C, a first interlayer dielectric layer 110 may be formed on a substrate 100. The substrate 100 and the first interlayer dielectric layer 110 may be substantially the same as those discussed with reference to FIGS. 2A to 2C.

Sacrificial patterns 112 may be formed in the first interlayer dielectric layer 110. Each of the sacrificial patterns 112 may extend along a first direction D1. The sacrificial patterns 112 may be spaced apart from each other in a direction parallel to a top surface of the substrate 100 and perpendicular to the first direction D1.

Each of the sacrificial patterns 112 may have a lower width 112_Wa greater than its upper width 112_Wb. The widths 112_Wa and 112_Wb of each of the sacrificial patterns 112 may be measured along a direction, which is parallel to the top surface of the substrate 100 and perpendicular to an extending direction of each of the sacrificial patterns 112. For example, the widths 112_Wa and 112_Wb of each of the sacrificial patterns 112 may be measured along a direction parallel to the top surface of the substrate 100 and perpendicular to the first direction D1.

The formation of the sacrificial patterns 112 may include forming in the first interlayer dielectric layer 110 first trenches 110a extending along the first direction D1, forming a sacrificial layer (not shown) to fill the first trenches 110a, and performing a planarization process until exposing a top surface of the first interlayer dielectric layer 110.

Each of the first trenches 110a may have a lower width greater than its upper width. The lower width and the upper width of each of the first trenches 110a may be measured along a direction, which is parallel to the top surface of the substrate 100 and perpendicular to an extending direction of each of the first trenches. For example, the lower width and the upper width of each of the first trenches 110a may be measured along a direction parallel to the top surface of the substrate 100 and perpendicular to the first direction D1. The first trenches 110a may include, for example, performing an anisotropic etching process to form preliminary first trenches (not shown) each having a uniform width, and performing a wet etching process to additionally etch lower portions of the preliminary first trenches. The present disclosure is, however, not limited thereto.

Figure 14A:
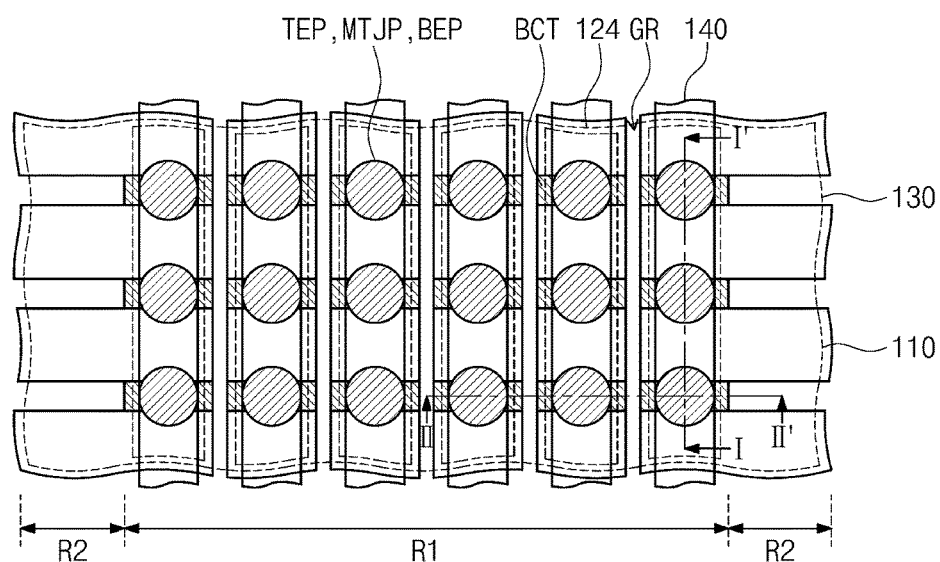
Figure 14A:
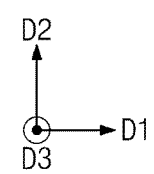
Figure 14B:
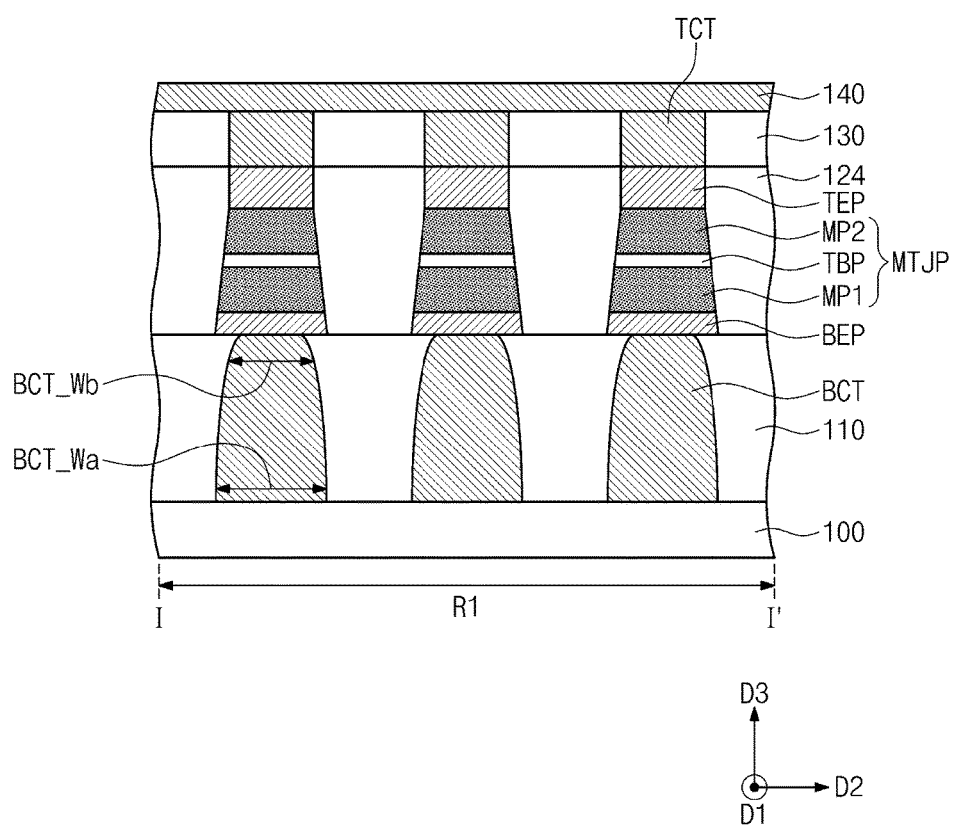
Figure 14C:
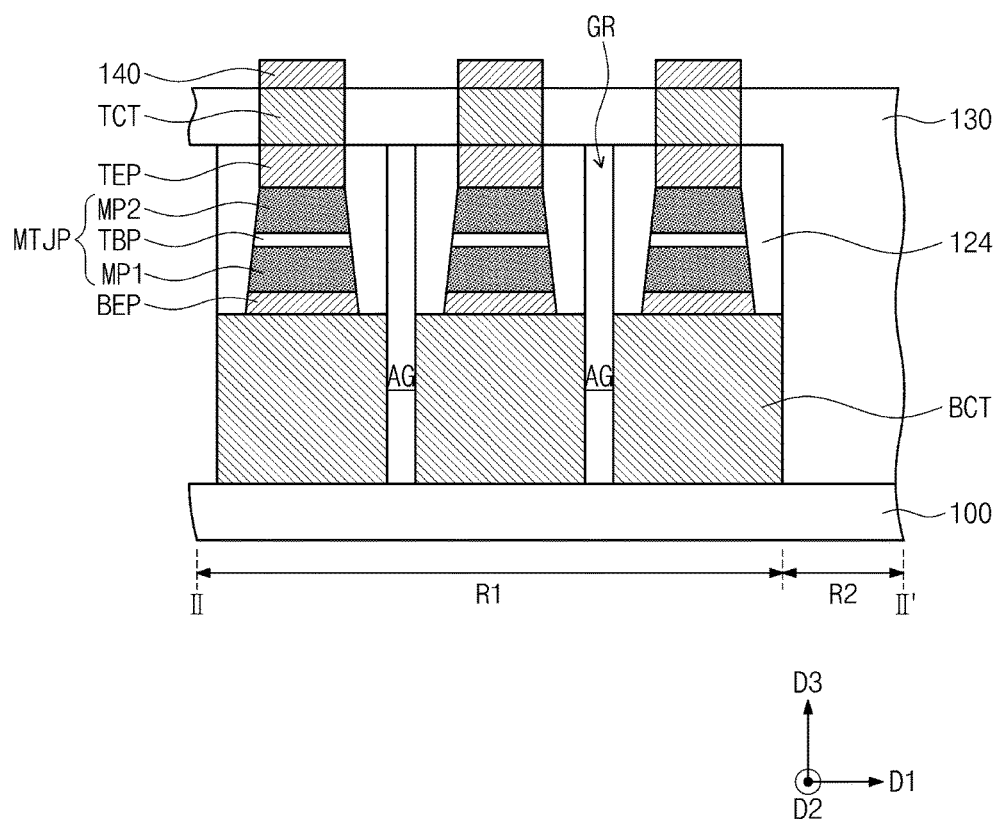

Referring to FIGS. 14A to 14C, bottom electrode patterns BEP, magnetic tunnel junction patterns MTJP, top electrode patterns TEP, sub-capping patterns 124, bottom contacts BCT, a second interlayer dielectric layer 130, top contacts TCT, and interconnect lines 140 may be formed by processes substantially the same as those discussed with reference to FIGS. 3A to 12A, 3B to 12B, and 3C to 12C.

Each of the bottom contacts BCT may have a lower width BCT_Wa in a direction perpendicular to the first direction D1 and an upper width BCT_Wb in a direction perpendicular to the first direction D1. The lower width BCT_Wa may be greater than the upper width BCT_Wb. Each of the bottom contacts BCT may thus have a relatively low resistance.

Figure 15A:
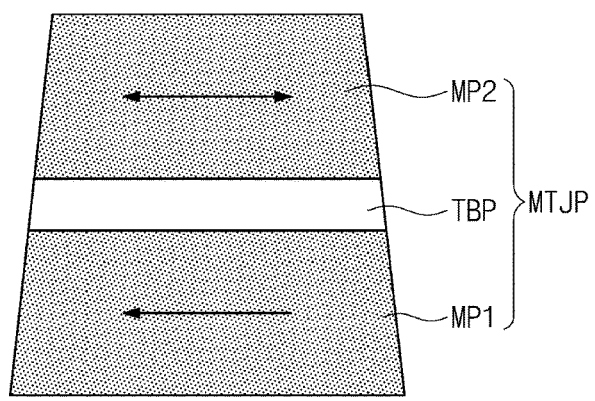
FIGS. 15A and 15B are schematic diagrams for explaining a magnetic tunnel junction pattern according to exemplary embodiments of the present disclosure.
Figure 15B:
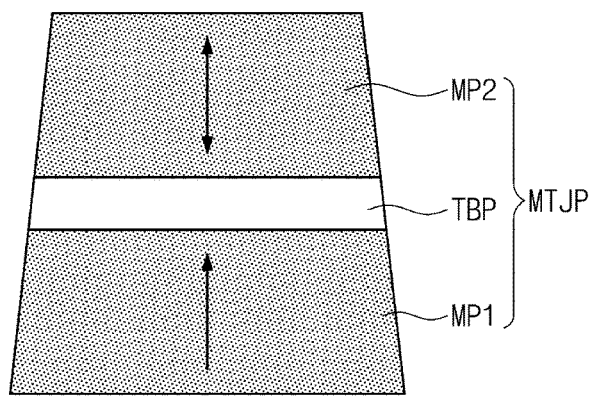

FIGS. 15A and 15B are schematic diagrams for explaining a magnetic tunnel junction pattern according to exemplary embodiments of the present disclosure. Each of the magnetic tunnel junction patterns MTJP may include a first magnetic pattern MP1, a tunnel barrier pattern TBP, and a second magnetic pattern MP2. One of the first and second magnetic patterns MP1 and MP2 may be a free pattern of a magnetic tunnel junction, and the other of the first and second magnetic patterns MP1 and MP2 may be a reference pattern of a magnetic tunnel junction. For brevity of the description, it will be described hereinafter about the case that the first magnetic pattern MP1 is a reference pattern and the second magnetic pattern MP2 is a free pattern. In an alternative embodiment, the first magnetic pattern MP1 is a free pattern and the second magnetic pattern MP2 is a reference pattern. Electrical resistance of the magnetic tunnel junction pattern MTJP may be sensitive to a relative orientation of magnetization directions of the free and reference patterns. For example, the electrical resistance of the magnetic tunnel junction pattern MTJP may be much greater when the relative orientation between the free and reference patterns is anti-parallel than when the relative orientation between the free and reference patterns are parallel. Consequently, the electrical resistance of the magnetic tunnel junction pattern MTJP may be controlled by changing the magnetization direction of the free pattern, and this difference in resistance may be used as a data storage mechanism for the magnetic memory device according to exemplary embodiments of the present disclosure.

Referring to FIG. 15A, the first and second magnetic patterns MP1 and MP2 may be magnetic layers for forming a structure with in-plane magnetization substantially parallel to a top surface of the tunnel barrier pattern TBP. In these exemplary embodiments, the first magnetic pattern MP1 may include a layer including an anti-ferromagnetic material and a layer including a ferromagnetic material. The layer including an anti-ferromagnetic material may include at least one of PtMn, IrMn, MnO, MnS, MnTe, $MnF_2$, $FeCl_2$, FeO, $CoCl_2$, CoO, $NiCl_2$, NiO, or Cr. In some embodiments, the layer including an anti-ferromagnetic material may include at least one selected from precious metals. The precious metals may include ruthenium (Ru), rhodium (Rh), palladium (Pd), osmium (Os), iridium (Ir), platinum (Pt), gold (Au), or silver (Ag). The layer including a ferromagnetic material may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic pattern MP2 may include a material having a changeable magnetization direction. The second magnetic pattern MP2 may include a ferromagnetic material. For example, the second magnetic pattern MP2 may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic pattern MP2 may be composed of a plurality of layers. For example, the second magnetic pattern MP2 may include a plurality of first layers including a plurality of ferromagnetic materials and a second layer including a non-magnetic material between the first layers. In this case, the first layers including the ferromagnetic materials and the second layer including the non-magnetic material may constitute a synthetic anti-ferromagnetic layer. The synthetic anti-ferromagnetic layer may reduce critical current density and enhance thermal stability of the magnetic memory device.

The tunnel barrier pattern TBP may include at least one of oxide of magnesium (Mg), oxide of titanium (Ti), oxide of aluminum (Al), oxide of magnesium-zinc (MgZn), oxide of magnesium-boron (MgB), nitride of titanium (Ti), or nitride of vanadium (V). For example, the tunnel barrier pattern TBP may be one single layer of magnesium oxide (MgO). Alternatively, the tunnel barrier pattern TBP may include a plurality of layers. The tunnel barrier pattern TBP may be formed using a chemical vapor deposition (CVD) layer.

Referring to FIG. 15B, the first and second magnetic patterns MP1 and MP2 may be magnetic layers for forming a structure with perpendicular magnetization substantially perpendicular to a top surface of the tunnel barrier pattern TBP. In these exemplary embodiments, the first and second magnetic patterns MP1 and MP2 may include at least one of a material having an L10 crystal structure, a material having a hexagonal close-packed lattice, or an amorphous RE-TM (Rare Earth Transition Metal) alloy. For example, the first and second magnetic patterns MP1 and MP2 may include at least one material having an L10 crystal structure such as $Fe_{50}Pt_{50}$, $Fe_{50}Pd_{50}$, $Co_{50}Pt_{50}$, $Co_{50}Pd_{50}$, and $Fe_{50}Ni_{50}$. Alternatively, the first and second magnetic patterns MP1 and MP2 may include a $Co_3Pt$ ordered alloy or a cobalt-platinum (CoPt) disordered alloy, in which platinum (Pt) is contained to have a content ranging from 10 to 45 at. % having a hexagonal close-packed lattice. Dissimilarly, the first and second magnetic patterns MP1 and MP2 may include at least one of amorphous RE-TM alloys, which contain at least one of iron (Fe), cobalt (Co), or nickel (Ni) and at least one of rare earth metals such as terbium (Tb), dysprosium (Dy), and gadolinium (Gd).

The first and second magnetic patterns MP1 and MP2 may include a material exhibiting an interface perpendicular magnetic anisotropy. The interface perpendicular magnetic anisotropy may refer to a phenomenon that a magnetic layer having an intrinsic in-plane magnetization property is caused to have a perpendicular magnetization direction influenced by its interface with a neighboring other layer. Herein, the term "the intrinsic in-plane magnetization property" may mean that a magnetic layer has a magnetization direction parallel to its widest surface thereof (or, parallel to a longitudinal direction thereof) when there is no external factor applied thereto. For example, when a substrate is provided thereon with a magnetic layer having the intrinsic in-plane magnetization property and no external factor is applied, a magnetization direction of the magnetic layer may be oriented substantially parallel to a top surface of the substrate.

For example, the first and second magnetic patterns MP1 and MP2 may include at least one of cobalt (Co), iron (Fe), or nickel (Ni). The first and second magnetic patterns MP1 and MP2 may further include at least one of non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), nitrogen (N), or any combination thereof. For example, the first and second magnetic patterns MP1 and MP2 may include CoFe or NiFe, and may further include boron (B). Additionally, in order to reduce its own saturation magnetization, the first and second magnetic patterns MP1 and MP2 may further include at least one of titanium (Ti), aluminum (Al), silicon (Si), magnesium (Mg), tantalum (Ta), or silicon (Si). The first and second magnetization patterns MP1 and MP2 may be formed using a sputtering process or a chemical mechanical deposition (CVD) process.

The magnetic tunnel junction layer MTJL discussed with reference to FIGS. 3A to 3C may include a material substantially the same as that of the magnetic tunnel junction pattern MTJP.

According to exemplary embodiments of the present disclosure, after the magnetic tunnel junction layer is patterned, the sacrificial patterns may be replaced with the bottom contacts. For example, the bottom contacts may be formed after the magnetic tunnel junction layer is patterned. When the magnetic tunnel junction layer is patterned, the first interlayer dielectric layer and the sacrificial patterns are exposed and partially etched. However, even when etching byproducts of the first interlayer dielectric layer and the sacrificial patterns are re-deposited on sidewalls of the magnetic tunnel junction pattern, the magnetic tunnel junction patterns may be free of short because all of the first interlayer dielectric layer and the sacrificial patterns include an insulating material. Thus, according to exemplary embodiments of the present disclosure, it may be possible to fabricate a magnetic memory device having enhanced reliability.

Although the present invention has been described in connection with the embodiments of the present invention illustrated in the accompanying drawings, it will be understood to those skilled in the art that various changes and modifications may be made without departing from the technical spirit and essential feature of the present invention. It thus should be understood that the above-described embodiments are not limiting but illustrative in all aspects.

What is claimed is:

1. A method of fabricating a magnetic memory device, the method comprising:
    forming an interlayer dielectric layer on a substrate;
    forming a sacrificial pattern in the interlayer dielectric layer;
    forming a magnetic tunnel junction pattern on the sacrificial pattern;
    after forming the magnetic tunnel junction pattern, selectively removing the sacrificial pattern to form a bottom contact region in the interlayer dielectric layer; and
    forming a bottom contact in the bottom contact region.

2. The method of claim 1, further comprising, before selectively removing the sacrificial pattern, forming a capping pattern covering the magnetic tunnel junction pattern,
    wherein the capping pattern partially exposes the sacrificial pattern.

3. The method of claim 1, wherein, as viewed in plan view, a portion of the magnetic tunnel junction pattern overlaps the sacrificial pattern, and another portion of the magnetic tunnel junction pattern overlaps the interlayer dielectric layer.

4. The method of claim 1, wherein forming the magnetic tunnel junction pattern comprises:
    forming a magnetic tunnel junction layer on the interlayer dielectric layer and the sacrificial pattern; and
    patterning the magnetic tunnel junction layer,
    wherein the sacrificial pattern is partially exposed by the patterning of the magnetic tunnel junction layer.

5. The method of claim 1, wherein the sacrificial pattern comprises an insulating material.

6. The method of claim 5, wherein the sacrificial pattern has an etch selectivity with respect to the interlayer dielectric layer.

7. The method of claim 5, wherein the interlayer dielectric layer includes silicon oxide and the sacrificial pattern includes silicon nitride.

8. The method of claim 5, wherein the interlayer dielectric layer includes silicon nitride and the sacrificial pattern includes silicon oxide.

9. A method of fabricating a magnetic memory device, the method comprising:
    providing a substrate including a first region and a second region that are adjacent to each other along a first direction;
    forming a first interlayer dielectric layer on the substrate;
    forming a sacrificial pattern in the first interlayer dielectric layer, the sacrificial pattern extending from the first region onto the second region along the first direction;
    forming magnetic tunnel junction patterns on the sacrificial pattern on the first region, the magnetic tunnel junction patterns being arranged along the first direction;
    after forming the magnetic tunnel junction patterns, selectively removing the sacrificial pattern to form a bottom contact region in the first interlayer dielectric layer on the first region; and
    forming a preliminary bottom contact filling the bottom contact region.

10. The method of claim 9, further comprising, before selectively removing the sacrificial pattern, forming a capping pattern covering the magnetic tunnel junction patterns,
    wherein, as viewed in a plan view, the capping pattern exposes the sacrificial pattern on the second region.

11. The method of claim 10, further comprising patterning the preliminary bottom contact to form bottom contacts spaced apart from each other in the first direction.

12. The method of claim 11, wherein the patterning of the preliminary bottom contact separates the capping patterns into sub-capping patterns spaced apart from each other in the first direction.

13. The method of claim 9, further comprising patterning the preliminary bottom contact to form bottom contacts spaced apart from each other in the first direction,
    wherein each of the bottom contacts is electrically connected to its corresponding one of the magnetic tunnel junction patterns.

14. The method of claim 13, further comprising forming a second interlayer dielectric layer covering the magnetic tunnel junction patterns,
    wherein air gaps are formed between the bottom contacts and below the second interlayer dielectric layer.

15. The method of claim 9, wherein, as viewed in a plan view, a portion of each of the magnetic tunnel junction patterns overlaps the sacrificial pattern, and another portion of each of the magnetic tunnel junction patterns overlaps the first interlayer dielectric layer.

16. The method of claim 9, wherein each of the magnetic tunnel junction patterns has a first width in a second direction perpendicular to the first direction, and the sacrificial pattern has a second width in the second direction, the first width being greater than the second width.

17. The method of claim 9, wherein the sacrificial pattern includes a lower portion having a lower width in a second direction perpendicular to the first direction and an upper portion having an upper width in the second direction, the lower width being greater than the upper width.

18. A method of fabricating a magnetic memory device, the method comprising:
    providing a substrate including a first region and a second region that are adjacent to each other along a first direction;
    forming a first interlayer dielectric layer on the substrate;
    forming a sacrificial pattern in the first interlayer dielectric layer, the sacrificial pattern extending from the first region onto the second region along the first direction;
    forming a magnetic structure on the sacrificial pattern on the first region;
    after forming the magnetic structure, selectively removing the sacrificial pattern to form a bottom contact region in the first interlayer dielectric layer on the first region; and
    forming a bottom contact filling the bottom contact region.

19. The method of claim 18, wherein forming the magnetic structure comprises sequentially depositing on the sacrificial pattern on the first region a bottom electrode layer, a magnetic tunnel junction layer, and a top electrode layer.

20. The method of claim 18, wherein forming the magnetic structure comprises sequentially depositing on the sacrificial pattern on the first region a bottom electrode layer, a first magnetic layer, a tunnel barrier layer, a second magnetic layer, and a top electrode layer.

* * * * *